United States Patent [19]
Shiraishi et al.

[11] Patent Number: 5,435,075
[45] Date of Patent: Jul. 25, 1995

[54] SPINDRIER

[75] Inventors: Hirofumi Shiraishi, Kurume; Kenji Yokomizo, Oonojo; Kazuyoshi Mizumoto, Kurume; Yoshiyuki Honda, Kumamoto, all of Japan

[73] Assignees: Tokyo Electron Limited, Tokyo; Tokyo Electron Kyushu Limited, Tosu, both of Japan

[21] Appl. No.: 43,731

[22] Filed: Apr. 7, 1993

[30] Foreign Application Priority Data

| Apr. 7, 1992 | [JP] | Japan | 4-114047 |
| Apr. 16, 1992 | [JP] | Japan | 4-122720 |
| Sep. 22, 1992 | [JP] | Japan | 4-277812 |
| Mar. 4, 1993 | [JP] | Japan | 5-044029 |

[51] Int. Cl.⁶ ............................................ F26B 17/24
[52] U.S. Cl. .................................. 34/58; 34/317; 34/187
[58] Field of Search ............... 34/312, 317, 318, 320, 34/325, 58, 186, 187, 69, 82

[56] References Cited

U.S. PATENT DOCUMENTS

| 4,735,000 | 4/1988 | Hayashi et al. | 34/317 |
| 5,050,316 | 9/1991 | Aigo | 34/58 |
| 5,150,532 | 9/1992 | Aigo | 34/58 |

FOREIGN PATENT DOCUMENTS 58-9325 1/1983 Japan.
1255227 10/1989 Japan.

Primary Examiner—Denise L. Gromada
Attorney, Agent, or Firm—Oblon, Spivak, McClelland, Maier, & Neustadt

[57] ABSTRACT

A spindrier comprises a box enclosing a plurality of wafers, a motor for rotating the wafers in the box, upper and lower clamp bars for holding the wafers face to face and substantially perpendicular to a rotating shaft of rotating means, and gas introducing and discharging mechanisms for generating a flow of clean gas in the box. A sectional area of an open bottom of the box is smaller than a sectional area of an open top of the box, and the gas flows from the open top to the open bottom.

14 Claims, 18 Drawing Sheets

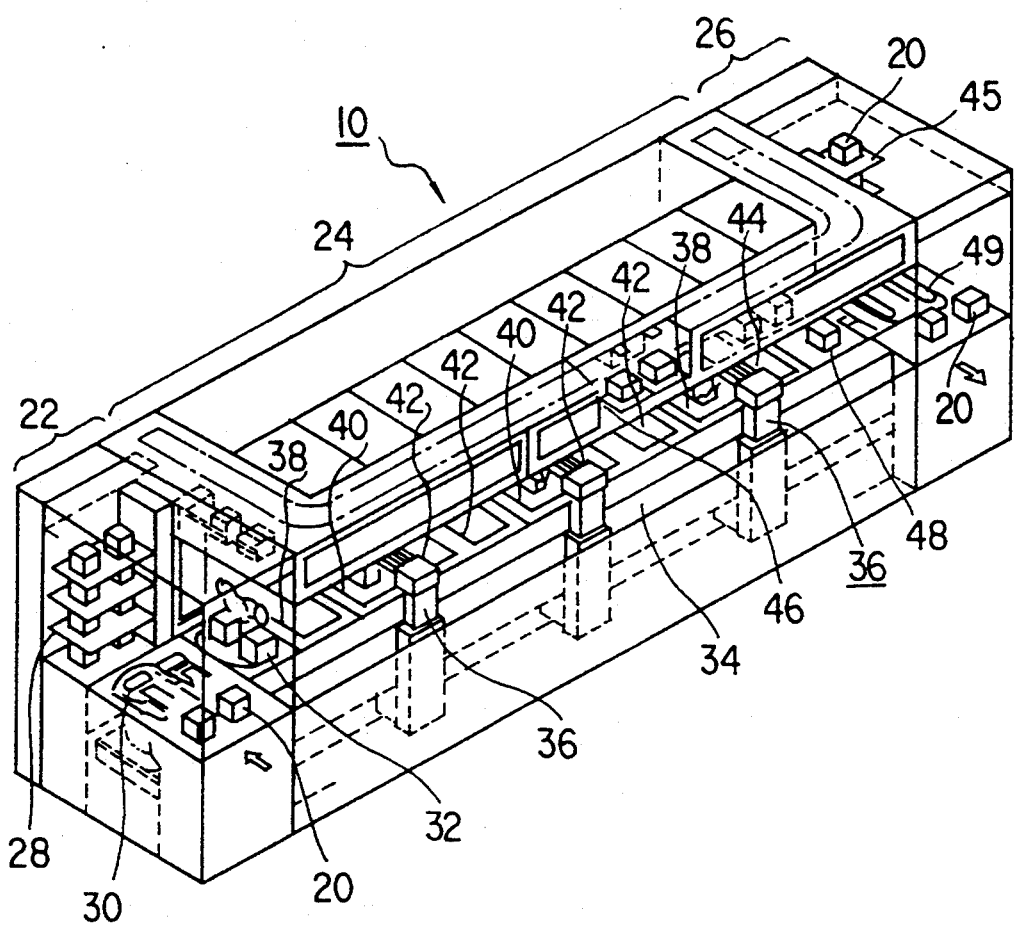
F I G. 1

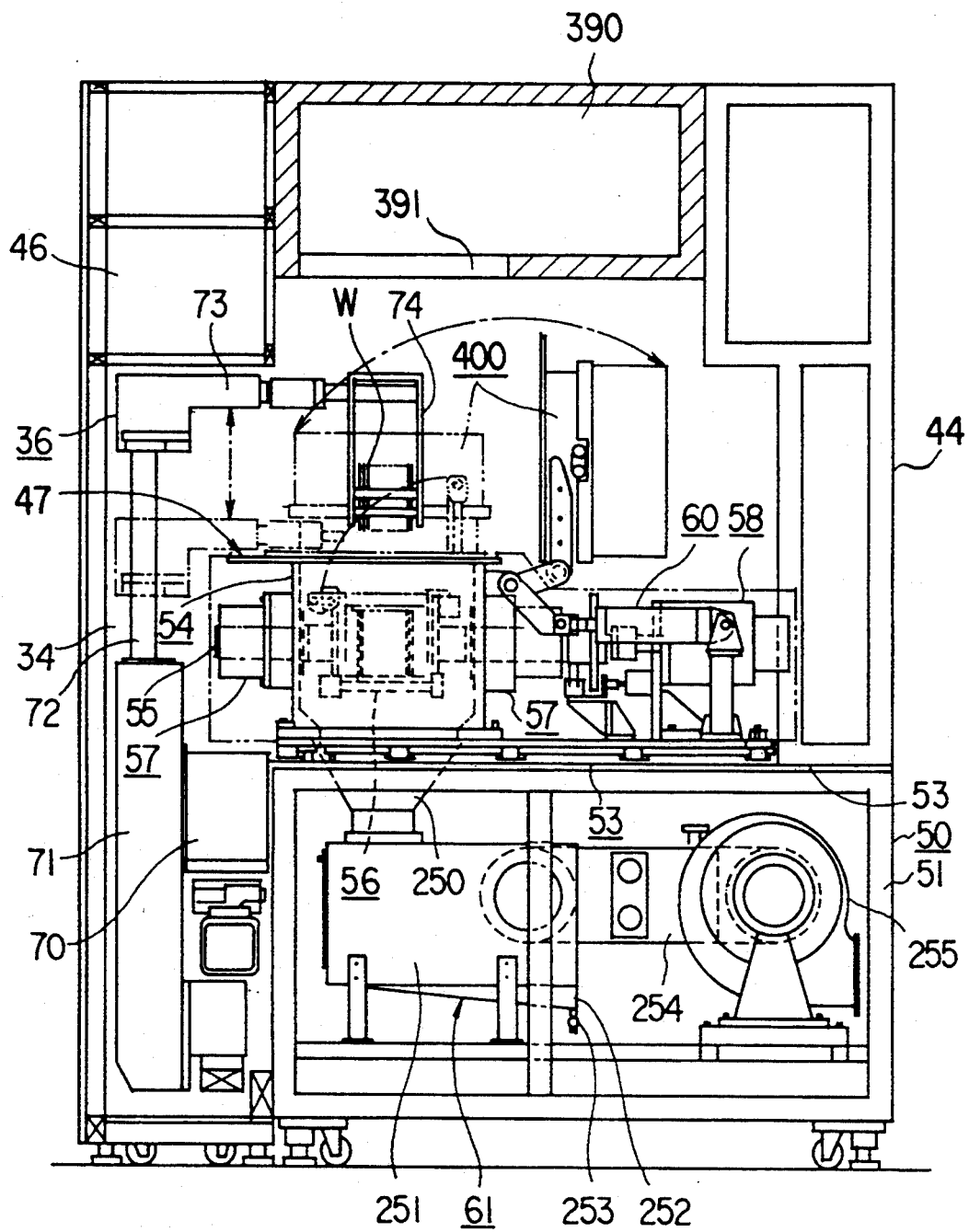
F I G. 2

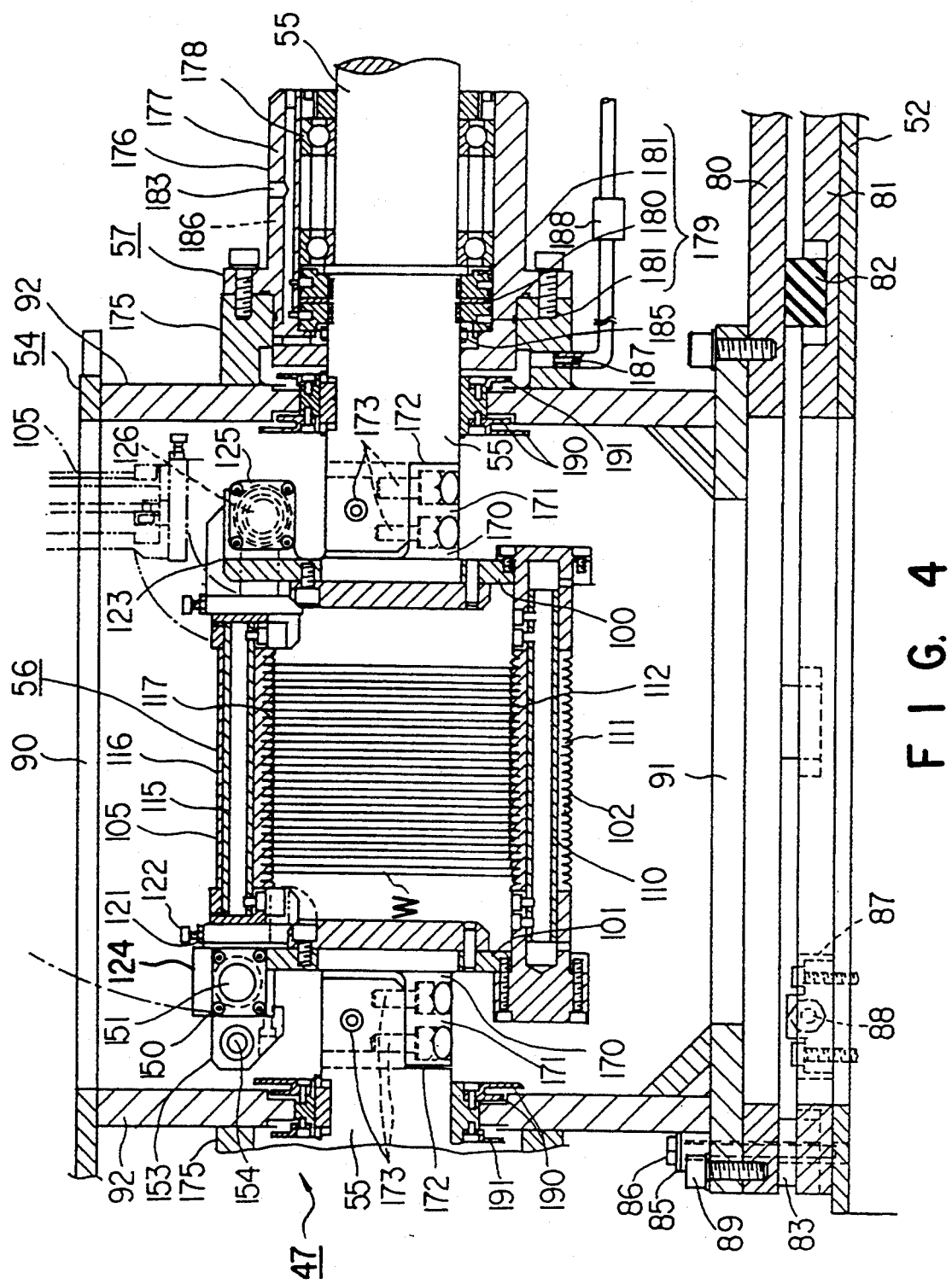
F I G. 4

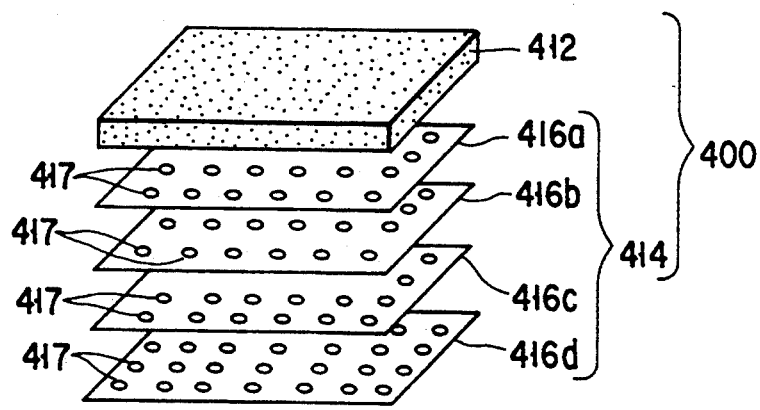
F I G. 7
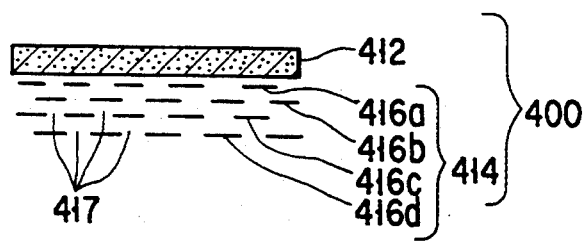
F I G. 8
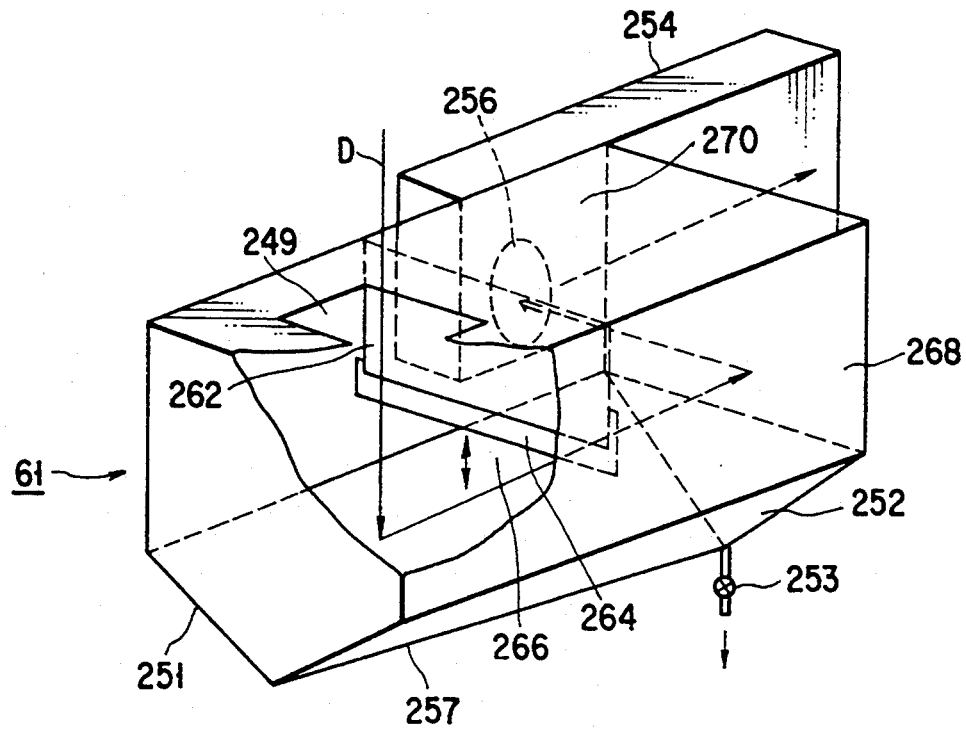
F I G. 9

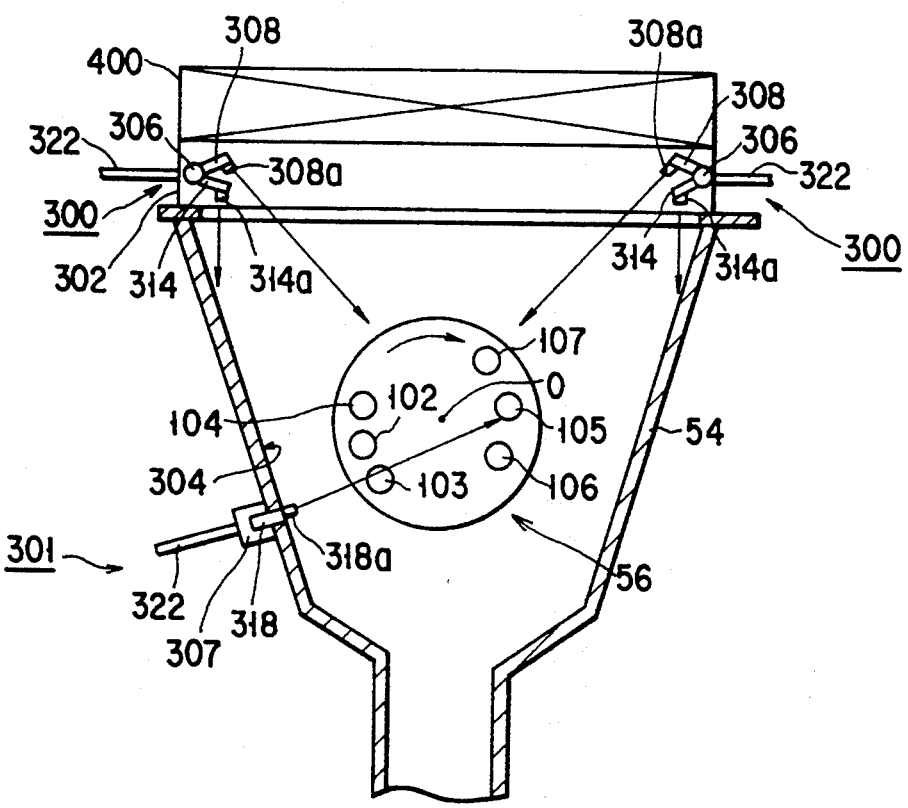
F I G. 10
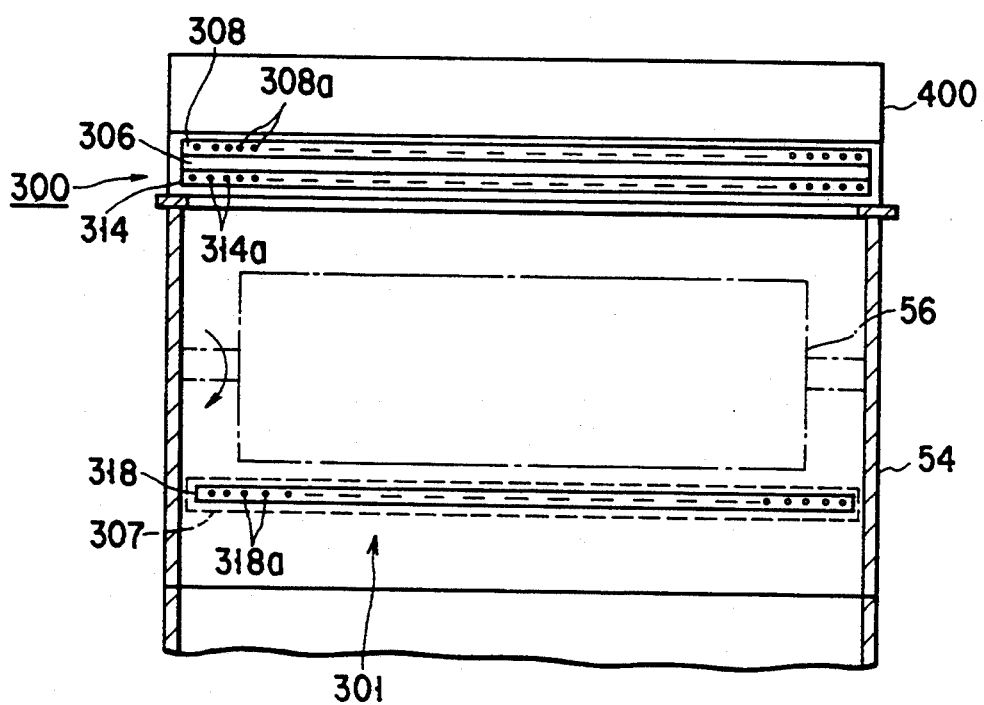
F I G. 11

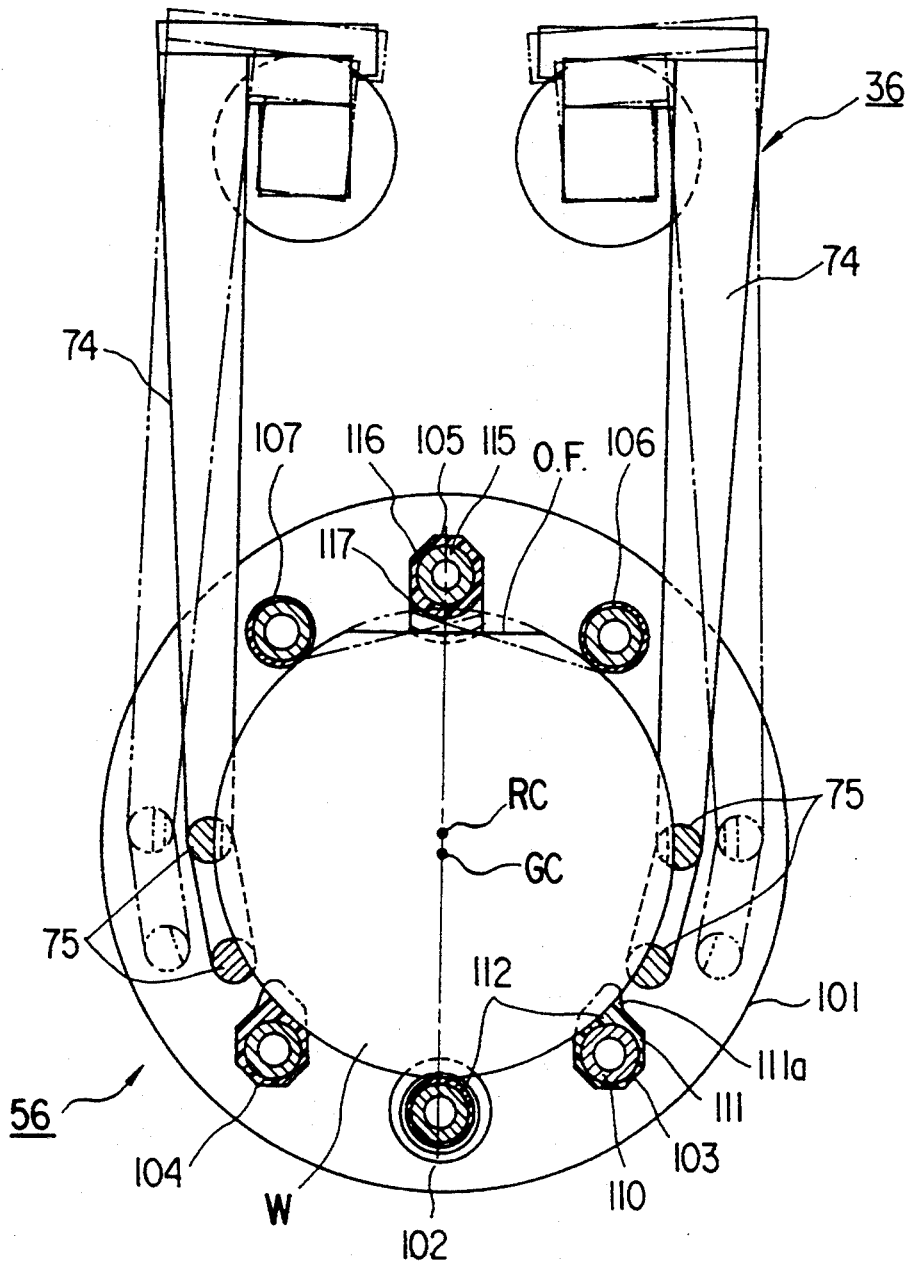
F I G. 16

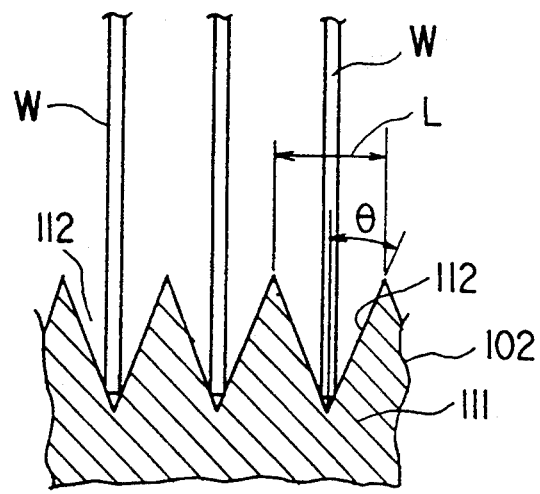
F I G. 17
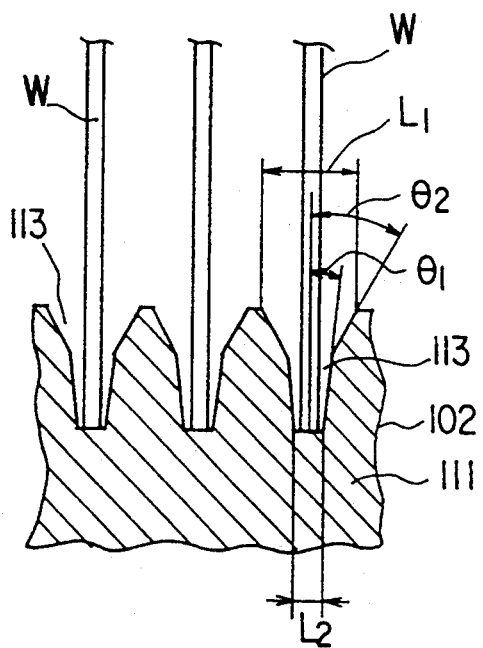
F I G. 18

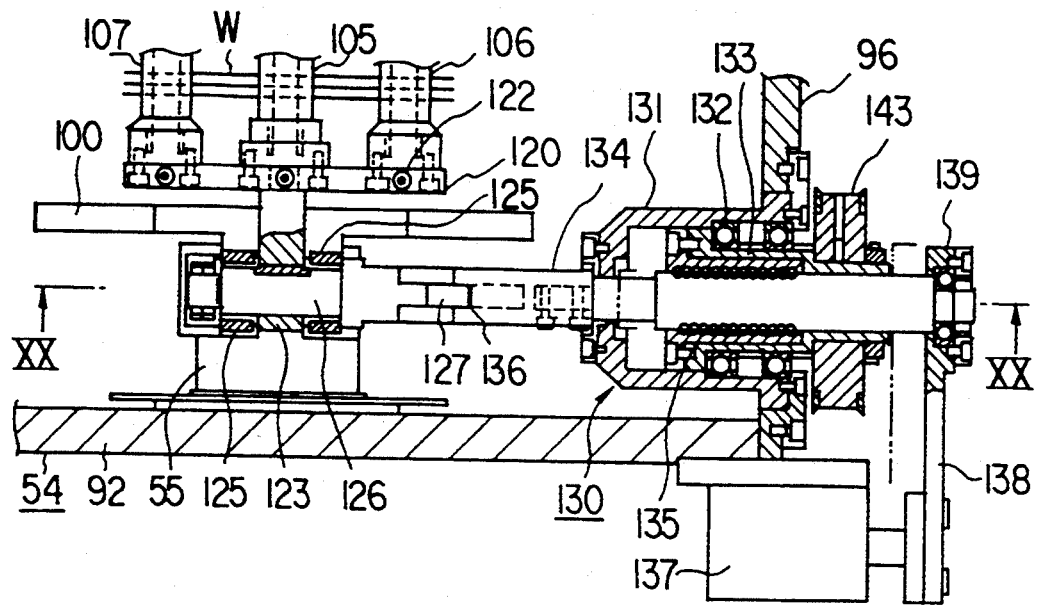
F I G. 19
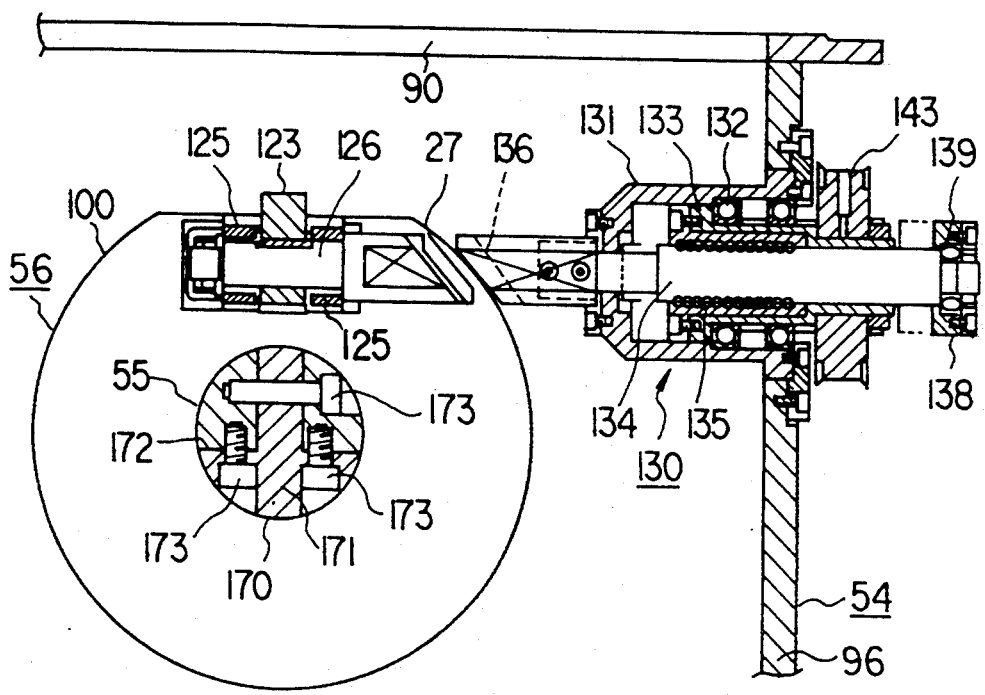
F I G. 20

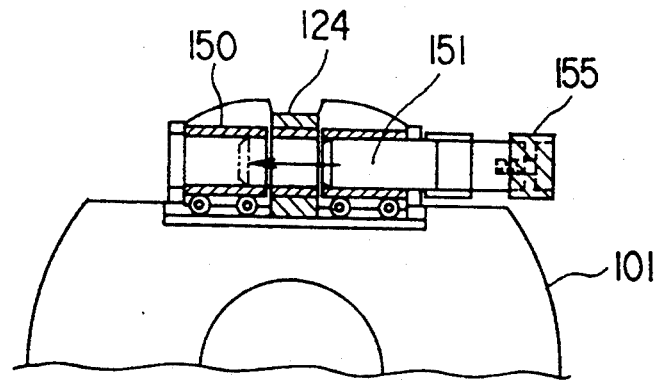
F I G. 23
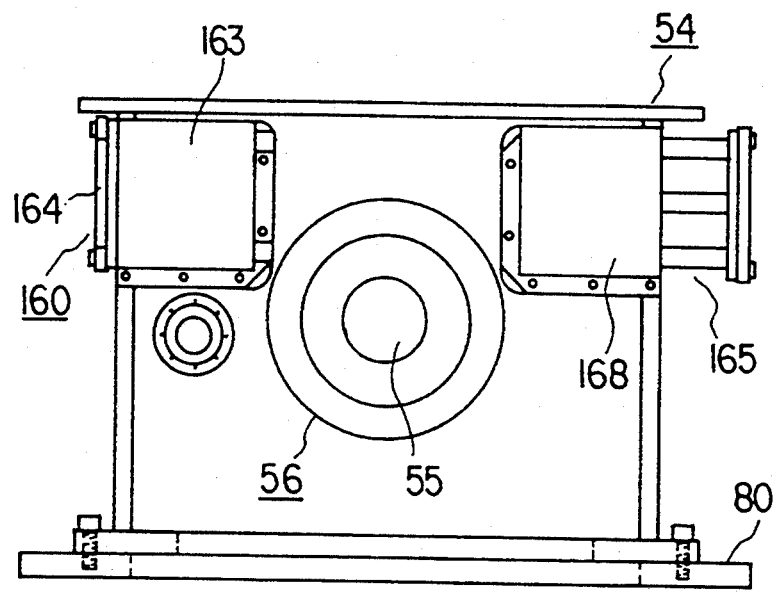
F I G. 24

SPINDRIER

BACKGROUND OF THE INVENTION

1. Field of the Invention

The present invention relates to a spindrier for drying substrates such as semiconductor wafers while removing solution or solution drops from them.

2. Description of the Related Art

Semiconductor devices such as super LSIs have been more and more highly integrated and their circuit patterns have been micro-structured to the order of submicrons. In addition, the diameter of wafers has been made large and larger, say, to 8 inches and 12 inches. Even if a quite little amount of particles which could be neglected should adhere to the surface of each wafer, therefore, the productivity of wafers will be lowered to a great extent. To solve this, the semiconductor wafers are immersed in acid and alkali solutions in cleaning vessels of the automatic cleaning system. Their surfaces can be thus made clean.

According to the automatic cleaning system, the wafers are washed by chemical solution and then water-washed and dried. A spindrier is used in the drying chamber of the automatic cleaning system in order to made the manufacturing efficiency of wafers high. Japanese Patent Disclosure Hei 1-255227 discloses one of these spindriers, however, air or gas is caused to flow perpendicular to the surface of each wafer and its flow is easily drifted in the housing. This makes it difficult to efficiently separate solution or solution drops from the wafers and to efficiently discharge particles and moisture content outside the housing.

Further, gas is likely to stay in the bottom portion and upper corners of the housing in the case of the conventional spindriers. If particles are contained in the gas thus stayed, therefore, they adhere to the wafers and contaminate them when the flow of gas is stopped.

Still further, the interval of each wafer set relative to each side wall of the clamp groove is so narrow as to allow solution to remain in it. This makes it impossible to completely dry the wafers.

SUMMARY OF THE INVENTION

An object of the present invention is therefore to provide a spindrier capable of more efficiently discharging solution or moisture content and particles outside the housing.

Another object of the present invention is to provide a spindrier capable of completely drying the wafers without leaving any solution in the interval between each clamp groove and the wafer in it.

According to an aspect of the present invention, there can be provided a spindrier comprising a box enclosing a plurality of substrates; means for rotating the substrates in the box; clamp holder means for holding the substrates face to face and substantially perpendicular to a rotating shaft of said rotating means; and means for generating a flow of gas in the box; wherein a sectional area of an open bottom of the box is smaller than a sectional area of an open top of the box, and the gas flows from the open top to the open bottom.

The gas flow generating means includes a gas introducing mechanism communicated a gas introducing opening at the top of the box and a gas discharging mechanism communicated with a gas discharging opening at the bottom of the box. When the box is arranged in this manner, gas is caused to flow from above to down in the box. It is preferable in this case that the gas introducing mechanism includes filter means and solution drops shielding means. The filter means allows gas to pass through the box, while the solution drops shielding means prevents solution drops separated from the substrates by centrifugal force from reaching the filter means. Further, it is preferable that the solution drops shielding means includes plural perforated plates each having a plurality of apertures and that the apertures of each plate are shifted from those of its adjacent one. Still further, it is preferable that the gas discharging mechanism includes a container or vessel in which gas to be discharged is caused to collide against inner faces of the container to separate solution or moisture content from it.

Still further, it is preferable that the clamp holder means includes clamp bars on each of which a plurality of grooves are formed and that each groove is V-or Y-shaped in section not to leave any solution in the intervals between each substrate and side walls of the groove.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a perspective view schematically showing the whole of the cleaning system;

FIG. 2 is a perspective view showing the drying chamber in which the spindrier is housed;

FIG. 4 is a vertically-sectioned view showing that part of our spindrier which is rotated;

FIG. 7 is a perspective view showing a filter assembly dismantled;

FIG. 8 is a sectional view showing the filter assembly;

FIG. 9 is a perspective view schematically showing a gas exhausting chamber attached to our spindrier;

FIG. 10 is a perspective and sectional view showing our spindrier viewed along the rotating shaft thereof, said spindrier having a cleaning assembly;

FIG. 11 is a perspective and sectional view showing our spindrier viewed in the direction perpendicular to the rotating shaft thereof, said spindrier having the cleaning assembly;

FIG. 16 is a sectional view intended to explain how the wafer is positioned relative to the rotary holder mechanism and also relative to wafer carrying arms;

FIG. 17 is a sectional view showing a part of a wafer clamp enlarged, said clamp being provide with V-shaped grooves;

FIG. 18 is a sectional view showing a part of a wafer clamp enlarged, said clamp being provided with Y-shaped grooves;

FIG. 19 is a vertically-sectioned view showing the upper holder member switching mechanism;

FIG. 20 is a sectional view taken along a line XIX—XIX in FIG. 19 to show the upper holder member switching mechanism;

FIG. 23 is a sectional view showing a lock section engaged with a rotor at the front end of the upper holder member switching mechanism;

FIG. 24 shows a drive section of the unlock mechanism at the front end of the upper holder member switching mechanism viewed from the front side thereof;

DETAILED DESCRIPTION OF THE PREFERRED EMBODIMENTS

Figure 3:
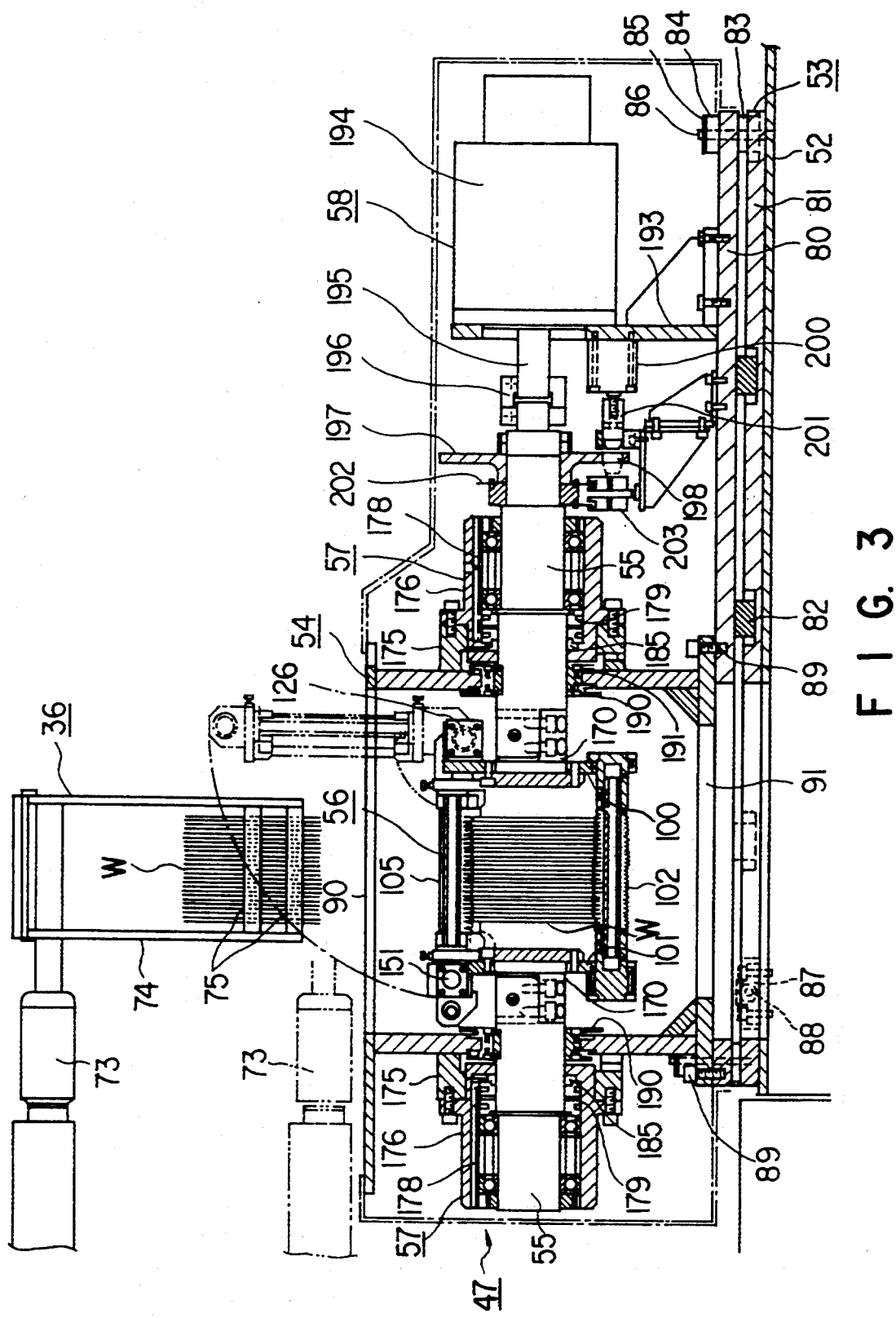
FIG. 3 is a vertically-sectioned view showing the drying chamber in which the spindrier according to an embodiment of the present invention is housed.

A case where the spindrier according to an embodiment of the present invention is applied to the process of cleaning semiconductor wafers will be described in detail with reference to the accompanying drawings.

As shown in FIG. 1, a cleaning system 10 includes three sections comprising cleaning, input and output buffer sections 24, 22 and 26. The input buffer section 22 is arranged by a loader section 32 of the cleaning section 24. The output buffer section 26 is arranged by an unloader section 48 of the cleaning section 24. The cleaning section 24 includes a lower cleaning area in which semiconductor wafers W are cleaned and an upper cleaning area in which cassettes 20 are cleaned.

Two cassettes 20 are received in the input buffer section 22. Each cassette 20 houses therein twenty five sheets of 8-inch silicon wafers w. Two units 30 for carrying the cassettes 20 are arranged on a turn-table A cassette stocking unit 28 is positioned at the rear side of the input buffer section 22.

The cleaning section 24 includes nine process divisions. These process divisions 38–44 are arranged side by side on a line to enable the wafers W to be sequentially processed in them. Two 38 of them are intended to clean and dry wafer chucks, two 40 of them to clean the wafers with chemical solution, four 42 of them to wash the wafers W with water, and final one 44 to dry the wafers W. Three wafer carrying units 36 are arranged along the line of these process divisions 38–44.

As shown in FIG. 2, each wafer carrying unit 36 is mounted on a truck 70 which can run in a passage 34. A lifter 71 of the wafer carrying unit 36 is attached to one side of the truck 70 and it includes a servomotor and a ball screw. Each wafer carrying unit 36 has a spin rod 72, an arm 73 and a wafer chuck 74, by which fifty two sheets of wafers W, maximum, can be held together. To add more, a pair of holder rods 75 are attache above and below to the lower portion of the chuck 74 and the wafers are held in grooves of each pair of holder rods 75.

A swing window (not shown) made by a transparent acryl plate is attached to the front of the cleaning section 24 to enable the process divisions 38–44 to be viewed from outside. A plurality of tanks (not shown) in which chemical solutions and pure water are contained are arranged at the rear side of the cleaning section 24. A cassette liner 46 is arranged above and along the wafer carrying passage 34.

As shown in FIG. 2, a spindrier 47 is housed in the wafer drying division 44. The rotating part of the spindrier 47 is arranged on a support base 50 and a rotary holder mechanism (or rotor) 56 is enclosed by a box (or housing) 54. The housing 54 is mounted on a top 52 of a support base frame 51 through an attaching base mechanism 53. The rotor 56 is connected to a shaft 55 of a motor 58. The shaft 55 is supported by cases 175 and 176 through bearing mechanisms 57. The open top of the box 54 is capped by clean air introducing mechanism 400, which is connected to the box 54 by hinge joints 402 and 404 each having a cylinder 60. The clean air introducing mechanism 400 serves to supply clean air into the box 54 and also serves as a cap to close the open top 399 of the box 54. The bottom of the box 54 is communicated with an air and solution discharging mechanism 61.

The rotary holder mechanism 56 for the spindrier 47 will be described referring to FIGS. 3, 4 and 14–18.

The rotary holder mechanism 56 is intended to hold fifty two sheets of wafers W erected at a same pitch interval. A pair of flywheels 100 and 101 are connected to and supported by the shaft 55 in such a way that they are opposed to each other on a same axial line. The shaft 55 passes through both sides 82 of the box 54 and it is connected to the rotor 56 by detachable assemblies 170.

Three lower holder members (or lower clamp bars) 102, 103 and 104 are arranged between the flywheels 100 and 101 at the lower portions thereof to connect and fix them. Three upper holder members (or upper clamp bars) 105, 106 and 107 are also arranged between the flywheels 100 and 101 at the upper portions thereof to connect and fix them.

Figure 14:
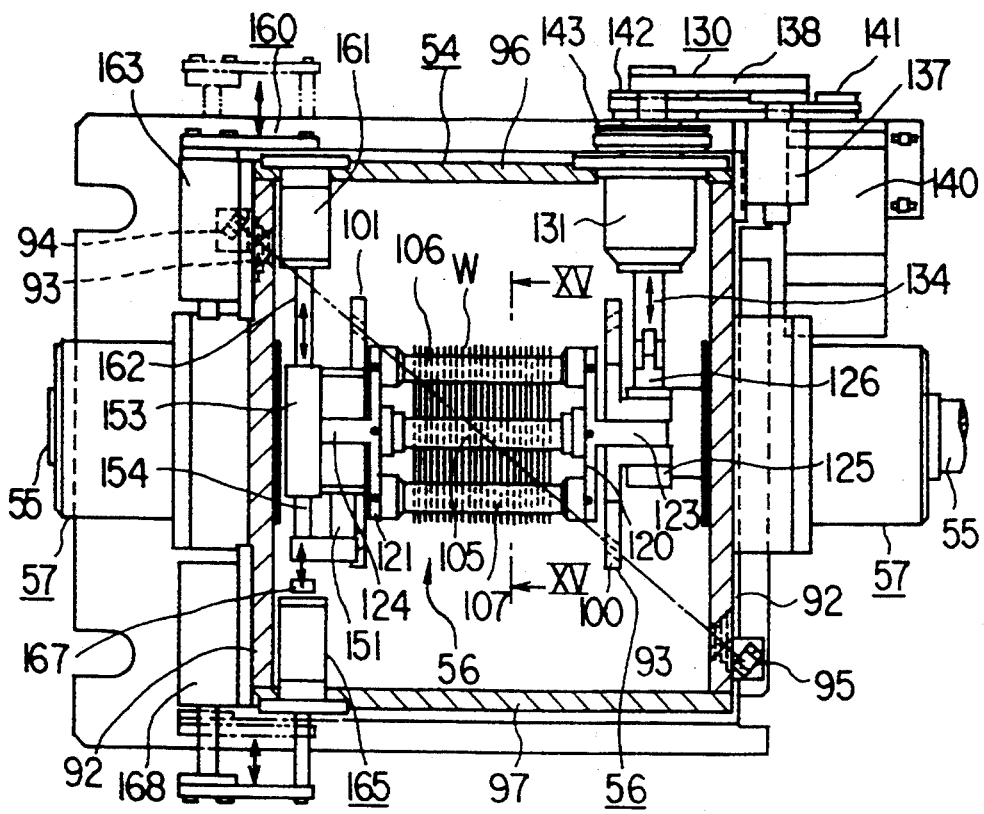
FIG. 14 is a perspective and sectional view showing rotary holder and bearing mechanisms and upper holder member switching and unlocking mechanisms.
Figure 15:
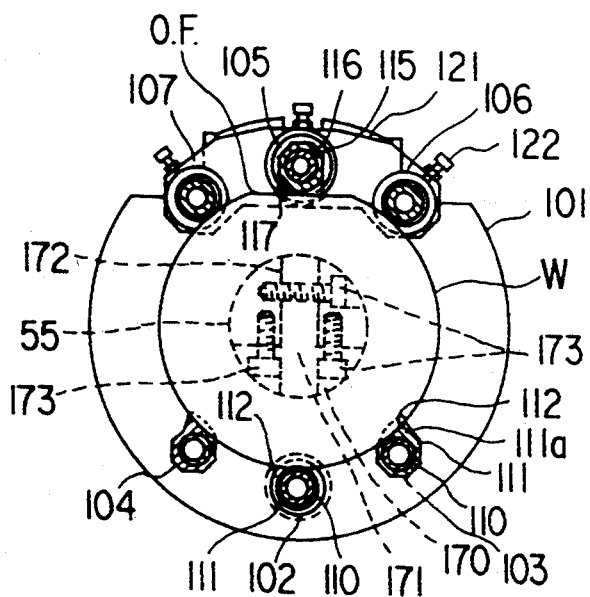
FIG. 15 is a sectional view taken along a line XV—XV in FIG. 14 to show the rotary holder mechanism.

As shown in FIGS. 14 and 15, the wafers W are rotated together with the upper and lower clamp bars 102–107 and the flywheels 100 and 101 at high speed. Each of the lower clamp bars 102, 103 and 104 is a double pipe made by cladding stainless-steel-made round pipe 110 by a fluoric-resin-made pipe 111. A plurality of grooves 112 (or 113) are formed round the fluoric-resin-made pipe 111 and a part of the rim portion of each wafer W is seated in its corresponding groove 112 (or 113) of the pipe 111. The number of these grooves is fifty two and they are arranged round the pipe 111 at a same pitch interval.

As shown in FIG. 17, the vertically-sectioned shape of each groove 112 is like a letter of V. The width or distance L between tops of each groove 112 is in a range of about 3-7 mm and the angle $\theta$ which the slope of each groove 112 has relative to a line vertically extending from the center of the groove 112 is about 20 degrees. It is preferable that the angle 8 is in a range of 15-45 degrees. Each wafer a has a width of about 0.5-0.8 mm. When each wafer W is seated in the groove 112, therefore, pure water and other cleaning solutions will not remain in any of clearances between the wafer W and the slopes of the groove 112.

As shown in FIG. 18, grooves 113 each having a shape of Y when vertically sectioned may be formed round the fluoric-resin-made pipe 111. The width or distance $L_1$ between tops of each groove 113 is in a range of about 3-7 mm and the bottom width $L_2$ of each groove 113 is about 0.85 mm. The angle $\theta_1$ which the lower slope of each groove 113 has relative to the line vertically extending from the center of the groove 113 is in a range of 5-8 degrees. It is preferable that the angle $\theta_1$ is in a range of 4-12 degrees. Further, the angle $\theta_2$ which the upper slope of each groove 113 has relative to the line is about 20 degrees. It is preferable that the angle $\theta_2$ is in a range of 20-45 degrees. When each wafer W is seated in the groove 113, the circumferential face of the wafer W is contacted with the bottom of the groove 113.

As shown in FIGS. 15 and 16, the outer pipe (or fluoric-resin-made pipe) 111 of the lower center support member 102 is shaped like a cylinder and the grooves 112 are formed round it. Each of the lower side support members 103 and 104 is also shaped like a cylinder but like a deformed on having a projection 111a projected from its outer pipe 111. The bottom of each groove 112 of the lower support members 103 and 104 is swelled in an inverted R to prevent the wafer W in each groove 112 from rolling sideward.

Three upper clamp bars 105, 106 and 107 serve to firmly hold the wafers W and to keep the balance of the rotating rotor 56 excellent. Each wafer W is positioned to direct its orientation flat (which will be hereinafter referred to as O.F.) toward these upper clamp bars 105, 106 and 107.

Each of the three upper support members 105, 106 and 107 has the same double pipe structure as that of the above-described lower support member 102. A plurality of grooves 117 are formed round a fluoric-resin-made pipe 116. Each groove 117 is substantially same in shape as the groove 112 of the lower clamp bar 102 but has a width a little larger than that of the groove 112.

As shown in FIG. 16, the gravity center GC of wafer W is a little shifted from the rotation axis center RC of the rotor 56 when wafers are clamp-held. In short, the rotation axis center RC is not on the gravity center RC but shifted toward its O.F.. When arranged in this manner, wafers are forced toward the lower support members 102, 103, 104 by centrifugal force and prevented from rolling in the rotor 56 during the rotation of the rotor 56. As the result, edges of wafers W will not be damaged and their noises will be reduced to a greater extent when they are being spin-dried.

Figure 25:
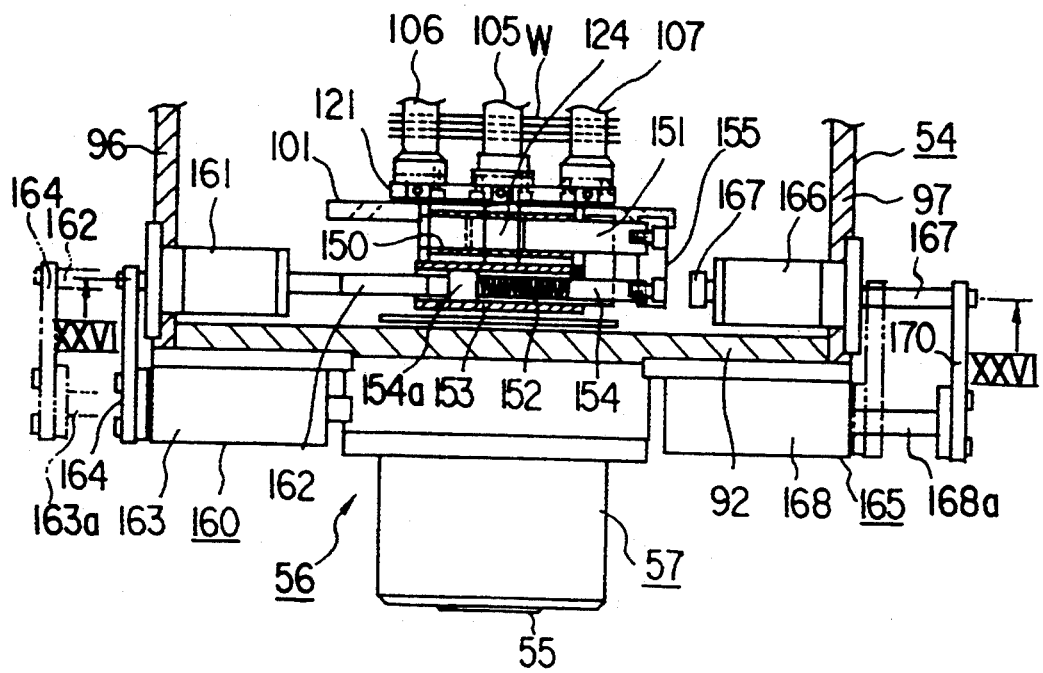
FIG. 25 is a horizontally-sectioned view showing the lock section and the unlock mechanism of the upper holder member.

As shown in FIGS. 3 and 4, the three upper clamp bars 105, 106 and 107 are supported swingable by a horizontal rod 126. When they are swung vertical (or they are released from there wafer clamping behavior), they do not disturb the wafer carrying-in and -out operation of the arm 36. When the upper clamp bars 105, 106, 107 are swung horizontal, as shown in FIG. 25 a lock pin 151 is inserted into a case 150 to thereby engage them with a flywheel 121.

The housing 54, the clean air introducing mechanism 400 and the air and solutions discharging mechanisms 61 will be described referring to FIGS. 5 through 9.

The box 54 serves as a drying housing enclosing the rotor 56 and it is made of stainless steel. It has an air introducing opening 399 at its top and a discharging opening 249 at its bottom end. It is gently choked downward (which forms a first choked portion) and then sharply choked toward its discharging opening 249 (which forms a second choked portion). Its air introducing opening 399 has a size of 580 mm × 550 mm.

Figure 6:
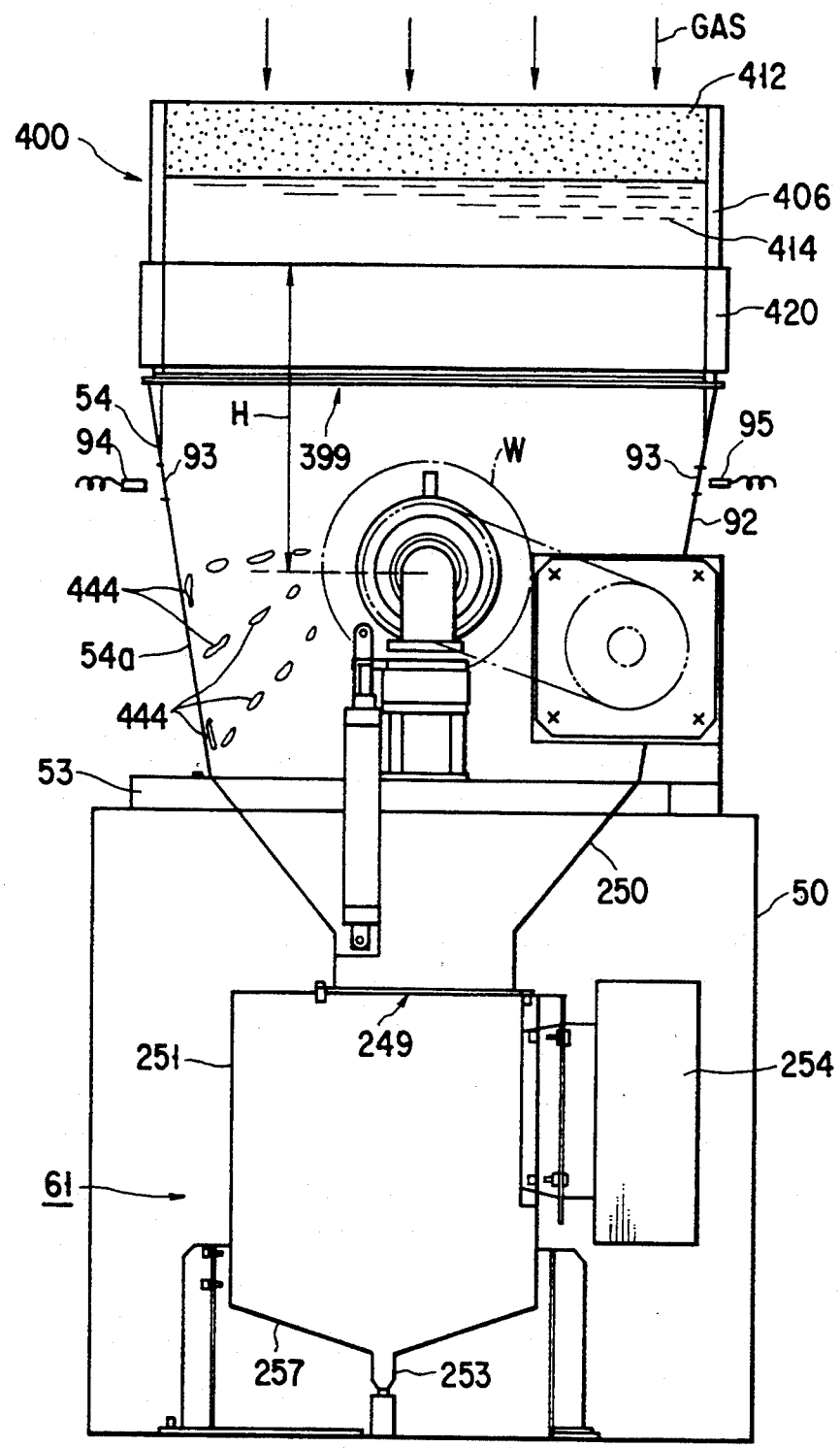
FIG. 6 is a perspective view showing the air current generator mechanism viewed from the side (or in a direction along the rotating shaft of our spindrier)

As shown in FIGS. 6 and 14, transparent acryl-made windows 93 are formed in both sides 92 of the box 54 and optical sensors 94 and 95 are arranged in front of these windows 93. The optical axis of the sensors 94 and 95 crosses the wafers w in the box 54.

As shown in FIG. 2, an air supply passage 390 is provided at the top of the drying division or chamber 44 and clean air flows downward into the clean air introducing mechanism 400 through an opening 391 of the passage 390. As shown in FIG. 6, the clean air introducing mechanism 400 is enclosed by an outer frame 406 and an auxiliary frame 420. The outer and auxiliary frames 406 and 420 are shaped like a rectangle and made of stainless steel. A ULPA filter 421 and a solution-shieding means 414 are arranged in the outer frame 406. The down flow of air passes through the filter 412 of the clean air introducing mechanism 400 and then through the solution shielding means 414. Solution drops separated from the wafers W by centrifugal force are shielded by the solution shielding means 414.

Figure 5:
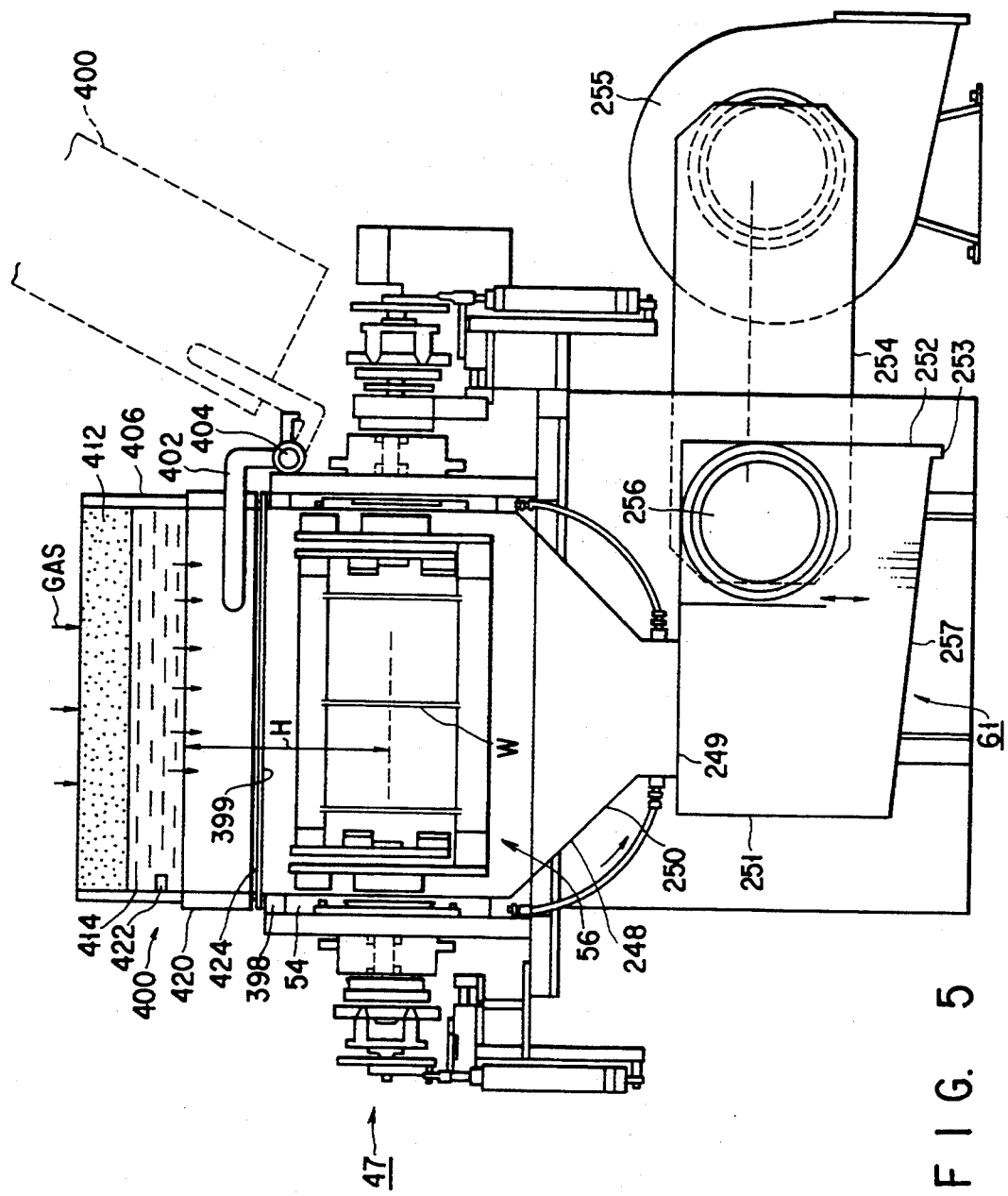
FIG. 5 is a perspective view showing an air current generator mechanism of our spindrier viewed from the front side (or in a direction perpendicular to the rotating shaft of our spindrier)

As shown in FIG. 5, the auxiliary frame 420 is attached to the lower end portion of the outer frame 406 and it serves as a spacer to adjust the distance H between the lower end of the solution shielding means 414 and the center of the wafers W. This distance H is set 300 mm, which is the longest or maximum value solution drops separated from the wafers W and having diameter of 5 mm can reach. An ionizer 422 is detachably attached to the inner face of the outer frame 406. When the wafers W are being dried, the ionizer 422 generates plus and minus ions to neutralize charge on the wafers W and remove it from them.

As shown in FIGS. 7 and 8, the solution shielding means 414 includes four punched plates 416a, 416b, 416c and 416d made of stainless steel and separated from one another. A plurality of ventilation holes 417 are formed in each of these punched plates 416a, 416b, 416c and 416d. The uppermost punched plate 416a is contacted with the underside of the filter 412. The lowermost punched plate 416b is opposed to the wafers W in the box 54. Ventilation holes 417 of the first punched plate 416a are shifted from those of the second punched plate 416b. Ventilation holes 417 of the second punched plate 416b are shifted from those of the third punched plate 416c and ventilation holes 417 of the third punched plate 416c are shifted from those of the fourth punched plate 416d. The fourth punched plate 416d has these ventilation holes 417 regularly scattered all over it. The number of the punched plates used as the solution shielding means 414 is not limited to four but it may be two, three or more than five.

As shown in FIG. 5, the cap 400 is swung round the shaft 404 by an angle large than 90°. Design consideration is added to the gravity center of the cap 400 to prevent the cap 400 from falling onto the box 54 when it is kept open and the cylinder breaks down. Further, a seal member 424 is arranged along the rim of the air introducing opening 399 of the box 54 to enable the cap 400 to be air-tightly contacted with the box 54. It is made of silicon rubber.

The air and solution discharging mechanism 61 will be described referring to FIGS. 9, 2, 5 and 6.

The opening 249 of the box 54 is communicated with a container 251 of the air and solution discharging mechanism 61. The container 251 is so shaped as to collect water to the center of its bottom 257. The whole of its bottom 257 is gently lowered toward its water collecting area 252, which is provided with a drain 253 through which water trapped is discharged outside.

A partition plate 262 is hung from the ceiling of the container 251 halfway into it. A flow rate adjuster plate 264 is attached, movable up and down, to the lower end of the partition plate 262 to adjust the sectioned area of a flow passage 266 which is formed under the plate 264. An opening 256 is formed in a side 270 of a chamber 268 which is formed down-stream the plate 262 in the container 251. This opening 256 is communicated with the air intake side of a blower 255 through a duct 254.

As shown by an arrow D in FIG. 9, gas exhausted enters from the box 54 into the container 251 through the opening 249. It then flows under the partition plate 262 in the container 251 and reaches the blower 255, passing through the opening 256 and the duct 254. In other words, the gas collides against the bottom 257 of the container 251 so that its flow can be changed to the horizontal direction. It then passes through the flow passage 266 under the adjuster plate 264 in the container 251 and again collides against a wall of the chamber 268 so that its flow can be further changed to the sideward direction. Moisture content in it can be therefore efficiently separated from it every time the direction in which it flows is changed. The moisture content can be thus collected on the bottom 257 of the container 251 and discharged outside through the drain 253.

The wafer drying process, particularly the gas flow in the housing 54 will be described below.

Clean air is taken from the side of the cover 400 into the box 54, while rotating the wafers w together with the rotor 56 and driving the duct 255. The clean air is introduced this time into the box 54 through the filter 412. Solution drops (or particle- and mist-like solutions) which have been separated from the wafers W by centrifugal force are blocked by the punched plate assembly 414 and thus prevented from scattering or spraying into the top portion of the box 54.

The open area of the filter cover 400 is made same in this case as the area of the top opening 399 of the box 54. This prevents the air from staying at the top corner sections of the box 54. In addition, the sectioned area of the box 54 becomes gradually smaller and smaller from upstream side to downstream side. The flow velocity of the air is thus made higher and higher as the flow of the air comes nearer to the downstream side of the box 54. The flow velocity of the air becomes about 1 m/sec., for example, at the bottom opening 249 of the box 54. As shown in FIG. 6, therefore, the spray of solution drops 444 which is caused when solution drops 444 collide against side walls 54a of the box 54, or finer ones of solution drops 444 which are splashed back by side walls 54a of the box 54 will not be returned to the wafers W but forced toward the bottom opening 249 of the box 54 by the high flow velocity of the air.

Other solution drops 444 which adhere to the tilted side walls 54a of the box 54 are also forced downward along side walls 54a by the air flow whose velocity becomes gradually higher and higher. When the sectioned area of the box 54 is made gradually smaller and smaller along the flow of air as described above, therefore, the flow velocity of air becomes higher and higher, so that solution drops present in the box 54 such as finer ones sprayed from the wafers W and splashed back by side walls 54a can be more quickly discharged outside the box 54.

The flow rate of clean air is about 17 m$^3$/min when the size of the open top 399 the box 54 is set 580 mm$\times$550 mm. Pressure difference inside and outside the box 54 is set about 50 mm H$_2$. The rotation number of the rotor 56 is raised from 0 to 500 rpm and this rotation number of 500 rpm is kept for about 60 seconds at the initial drying process. Large solution drops adhering to the wafers are thus splashed away from the wafer W. The rotation number of the rotor 56 is then raised to 1500 rpm and this rotation number of 1500 rpm is kept for 2-3 minutes at the medium drying process. Small solution drops adhering to the wafers W are thus splashed away from the wafers W. The rotor 56 is then stopped and kept this state for about 20 seconds at the final drying process to completely dry the wafers W. As the result, solution can be completely removed from surfaces of 25 sheets of the wafers W. In other words, they can be completely dried.

Solution drops each having a large diameter of about 5 mm and separated from the wafers W by centrifugal force can hardly reach the lowermost perforated plate 416d at the initial drying process during which the rotor 56 is rotated at low speed. This is because the punched plate assembly 414 is arranged sufficiently high above the wafers w. The punched plates 416a–416d and the filter 412 can be thus kept not soaked.

Small (or mist-like) solution drops separated can hardly reach the filter 412 at the medium drying process during which the rotor 56 is rotated at high speed. This is because ventilation holes 417 of each punched plate are shafted from those of its corresponding punched plates. The capacity of the filter 412 can be thus kept full.

Further, the lowermost perforated plate 416d has plural aperatures 417 uniformly arranged all over it. This enables the clean air not to be drifted but to flow down, as a laminar flow, into the box 54.

Still further, the gravity center GC of the wafers W is shifted from the rotation center RC of the rotor 56. When the rotor 56 is being rotated, therefore, the wafers W are pushed toward one circumferential side of the rotor 56, to that they cannot be vibrated to cause any noise.

As shown in FIG. 10, means 300 and 301 may be attached to the box 54 to clean the wafers W. Each upper cleaning means 300 has two-type nozzles 308 and 314, through one 308 of which cleaning solution is sprayed onto the rotor 56 and through the other 314 of which cleaning solution is sprayed onto side walls 304 of the box 54. A header 306 is common to both of the nozzles 308 and 314. The lower cleaning means 301 has a one-type nozzle 318 and a header 307.

As shown in FIG. 11, each of the headers 306 and 307 is arranged horizontal and parallel to the rotor 56, extending from one side to the other of the box 54 in the width direction thereof. Each of the nozzles 308, 314 and 318 has a plurality of apertures 308a, 314a or 318a aligned on a straight line, and cleaning solution is sprayed through these apertures of each nozzle. Those faces of the clamp bars 102, 103, 104, 105, 106 and 107 which are directed toward a rotating shaft 0 of the rotor 56 can be surely cleaned by the lower cleaning means 301. The amount of cleaning solution jetted through each nozzle 308, 314 or 318 is about 5/min and this cleaning process is carried out while rotating the rotor 56 at a speed o 500 rpm. Dry air or nitrogen gas may be jetted through the nozzles 308, 314 and 318 to dry the rotor 56 and the wafers W.

Figure 12:
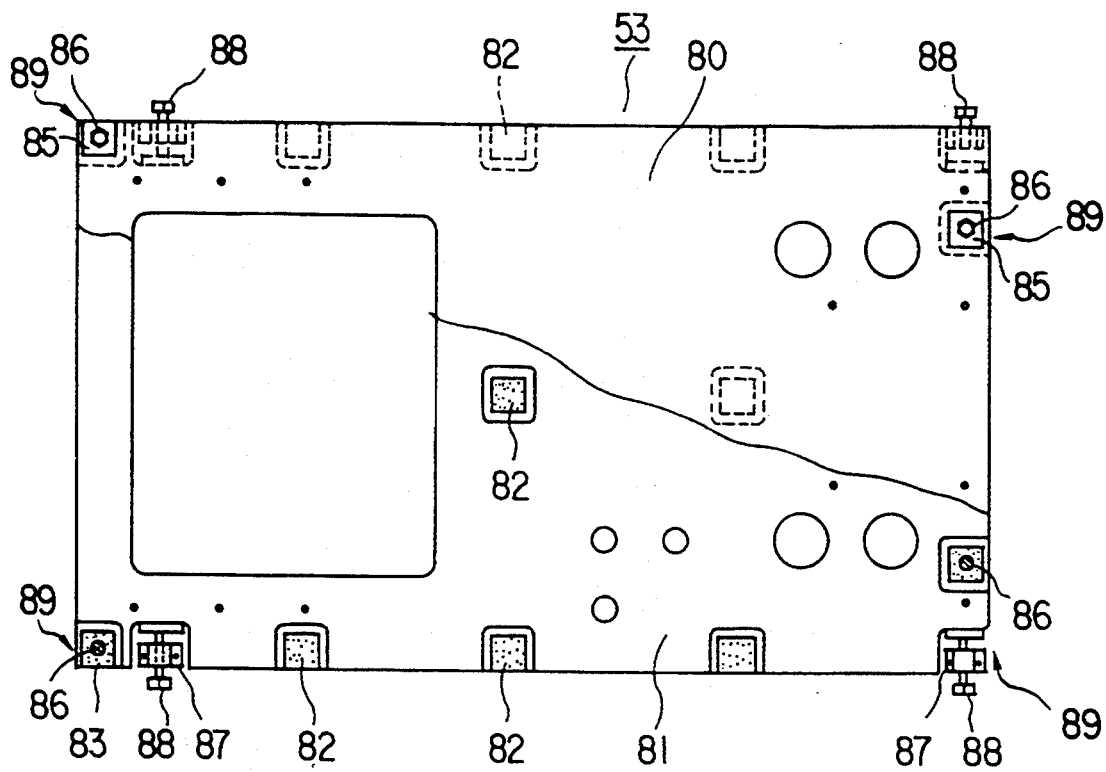
FIG. 12 is a plan showing a base of our spindrier partly cut away.
Figure 13:
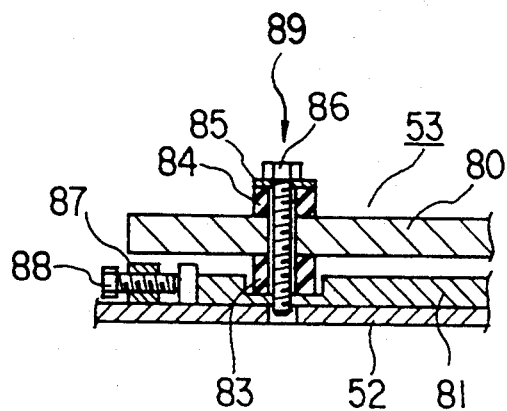
FIG. 13 is a vertically-sectioned view showing a part of the base.

As shown in FIGS. 12, 13 and 2, the attaching base mechanism 53 is mounted on the top of the frame 51 of the truck 50. It is intended to support the box 54 and other components and it serves to accurately position the box 54 relative to the wafer carrying arm 36 whose position can be adjusted in directions X, Y and Z. It includes two upper and lower base plates 80 and 81, which can prevent vibration caused when the rotor 56 and the motor 58 are rotated from being transmitted to those components which are arranged around the rotor 56 and the motor 58. Plural vibration-proof rubber pieces 82 are interposed between the upper 80 and the lower base plate 81.

As shown in FIG. 13, the upper and lower base plates 80 and 81 are connected to each other at their four corners by vibration-proof couplings 89. Each of these couplings 89 comprises rubber bushes 83, 84, a washer 85 and a bolt 86. Position adjusting means 87 and 88 are arranged adjacent to each of four corners of the lower base plate 81.

The rotor 56 will be described referring to FIGS. 14–16 and 19–26.

As shown in FIGS. 14 and 15, both ends (or base and front ends) of each of the three upper clamp bars 105, 106 and 107 are connected and fixed to substantially arc-like brackets 120 and 121 by position adjuster bolts 122. The brackets 120 and 121 are made of stainless steel. The bracket 120 is located on the side of the motor 58. Protrusions 123 and 124 are projected from rear sides of the brackets 120 and 121 and when viewed as a plan, therefore, the brackets 120 and 121 are shaped substantially like a letter of T. Each of the protrusions 123 and 124 is a thick member having bolts holes.

The protrusion 123 is fitted into a shaft 126 through a rotation-stopping wedge. The shaft 126 is rotatably supported by bearing assemblies 125. The bearing assemblies 125 are of the two-divided type and made of PEEK and they are fixed to the upper rear side of the flywheel 100. The protrusion 123 is located between the bearing assemblies 125. When the shaft 126 is swung by a mechanism 130, the upper clamp bars 105, 106 and 107 are swung together with the shaft 126 and they are thus erected.

The mechanism 130 as shown in FIGS. 14, 19 and 20. It includes a bearing housing 131, a rotary shaft sleeve 133 and a transmission shaft 134. The bearing housing 131 is sealingly attached to that portion of one side 96 of the box 54 which as opposed to the direction of the shaft 126 extended. The rotary shaft sleeve 133 is rotatably supported by bearings 132. The transmission shaft 134 is passed through the rotary shaft sleeve 133.

As shown in FIG. 14, the mechanism 130 is usually retreated not to interfere with the rotor 56 but it is pushed from one side of the box 54 and engaged with the shaft 126 only when the upper clamp bars 105, 105 and 107 are to be erected.

As shown in FIG. 20, one end of the shaft 126 is obliquely cut and an engaging projection (or tenon) 127 is formed on this obliquely-cut face of the shaft 126. The transmission shaft 134 and the rotary shaft sleeve 133 are locked each other by a mechanical lock 135 and rotated together. The transmission shaft 134 is freely reciprocated in its thrusting direction and its front end is obliquely cut. An engaging recess (or mortise) 136 is formed on this obliquely-cut face of the shaft 134. When the transmission shaft 134 advances, the recess 136 on its front end is engaged with the projection 127 on the rear end of the shaft 126, so that rotation force can be transmitted from it to the shaft 126. When retreated, it is released from the shaft 126.

Figure 21:
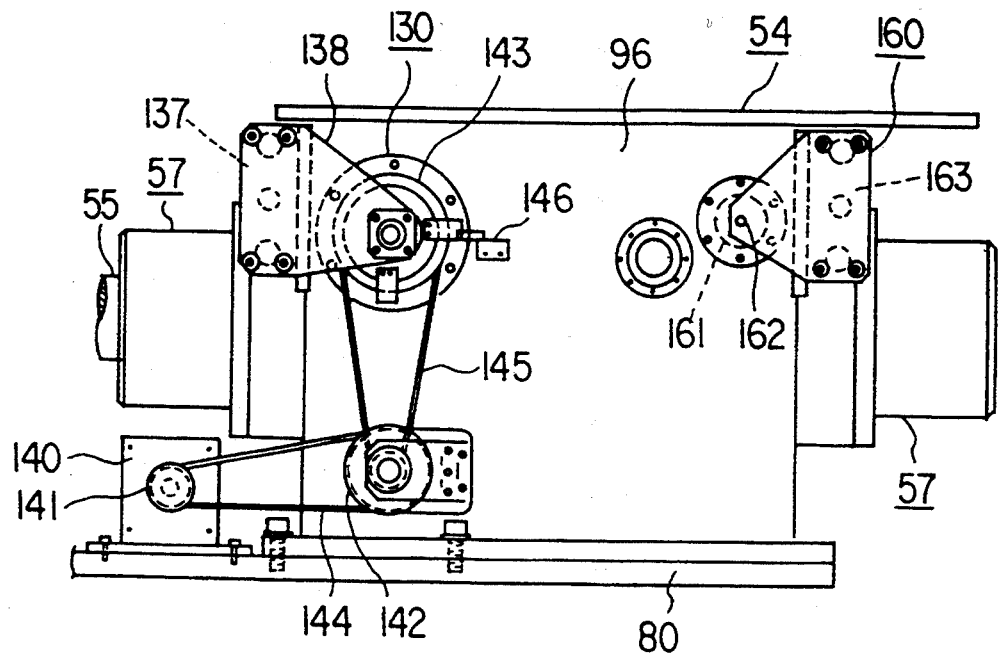
FIG. 21 shows a drive section of the upper holder member switching mechanism viewed from the side thereof.
Figure 22:
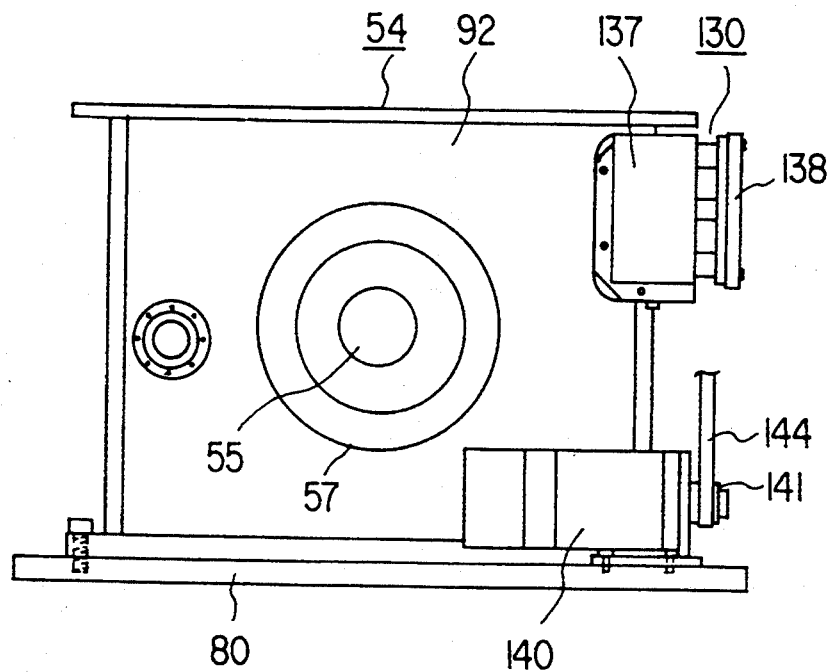
FIG. 22 shows the drive section viewed from the front side thereof.

As shown in FIGS. 21 and 22, an air cylinder 137 is arranged outside the one side 92 of the box 54 to reciprocate the transmission shaft 134. One end of a coupling arm 138 is connected to the front end of a piston rod in the air cylinder 137. The other end of the coupling arm 138 is connected to the rear end of the transmission shaft 134 through a thrust ball bearing 139. A motor 140 for the transmission shaft 134 is arranged on an upper base plate 80. A belt 144 is stretched between drive and reduction pulleys 141 and 142. Another belt 145 is stretched between the reduction pulley 142 and a transmission pulley 143. When the motor 140 is made operative, the rotary shaft sleeve 133 is rotated together with the transmission shaft 134 to thereby transmit rotation force to the shaft 126. The angle to which the shaft 126 is rotated or swung is detected by a sensor 146 and the motor 140 is controlled on the basis of values thus detected.

The lock mechanism by which the upper clamp bar bracket 121 is locked to the flywheel 101 will be described referring to FIGS. 23–26 and 14.

As shown in FIG. 25, the projection 124 of the bracket 121 is inserted into a sleeve 150 when the upper clamp bars 105, 106 and 107 are locked. The sleeve 150 is of the two-divided type and made of PEEK and it is fixed to the upper rear side of the flywheel 101. When the upper clamp bars 105, 106 and 107 are to be locked, a lock pin 151 which is inserted into the sleeve 150 from one end thereof is pushed deeper into the sleeve 150.

Figure 26:
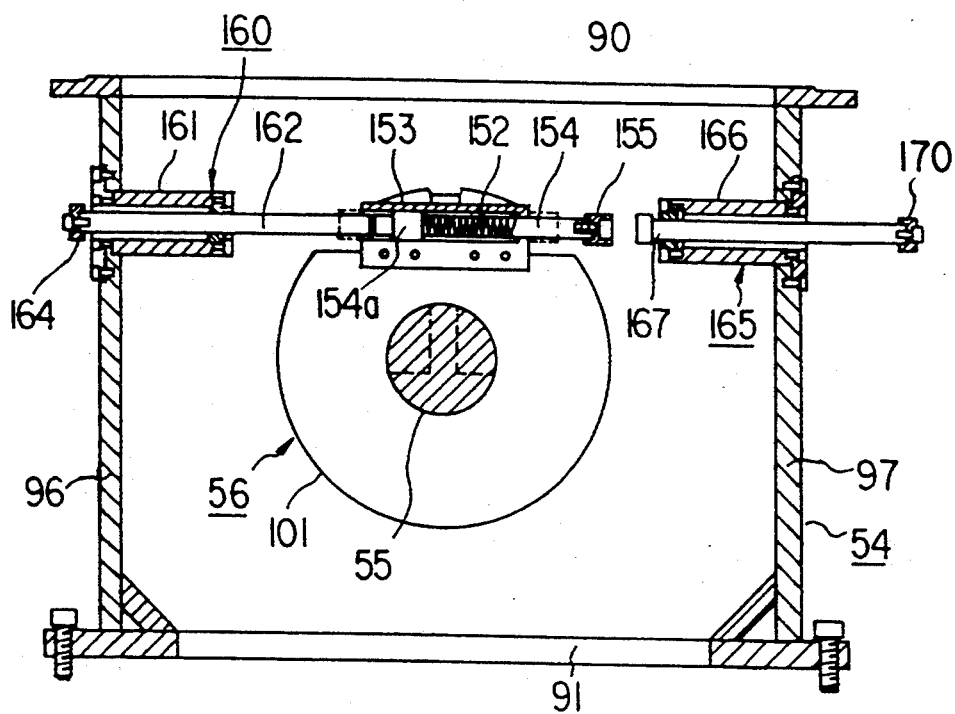
FIG. 26 is a sectional view taken along a line XXVI—XXVI in FIG. 25 to show the lock section and the unlock mechanism.

As shown in FIG. 26, a lock spring 152 is used as the means for pushing the lock pin 151 deeper into the sleeve 150 as described above. This lock pin 152 is wound round a slide pin 154, which has a large-diameter portion 154a and which is arranged slidable in a guide sleeve 153. The guide sleeve 153 is fixed to the rear side of the sleeve 150 for the flywheel 101.

As shown in FIG. 25, the lock pin 151 and the slide pin 154 are connected to each other by a coupling member 155 and they are urged by the lock spring 152 to advance deeper into their corresponding guide sleeves 150 and 153. An unlock mechanism 160 is arranged to the other side 96 of the box 54. It includes a sleeve-like guide member 161, a push rod 162 and an air cylinder 163. The sleeve-like guide member 161 is sealingly attached to that portion of the side 96 which is opposed to one end of the slide pin 154. The push rod 162 is slidably fitted into the sleeve-like guide member 161. The air cylinder 163 is intended to reciprocate the push rod 162. It is located outside the side 92 of the box 54. Its piston rod 163a and the push rod 162 are connected to each other by a coupling arm 164. When the piston rod 163a is advanced, the push rod 162 pushes the slide pin 154 against the lock spring 152, so that the lock pin 151 can be released (or unlocked) from the hole in the projection 124 of the bracket 121.

A lock confirming detector mechanism 165 is arranged in opposite to the unlock mechanism 160. It includes a sleeve-like guide member 166, a detecting rod 167 and air cylinder 168. The sleeve-like guide member 166 is sealingly arranged to that portion of the side 97 of the box 54 which is opposed to the other end of the slide pin 154. The detecting rod 167 is slidably fitted into the sleeve-like guide member 166 to detect how deep the lock pin 151 is pushed into the sleeve 150. A piston rod 168a and the detecting rod 167 are connected to each other by a coupling member 170. When the piston rod 168a is retreated into the air cylinder 168 by a predetermined stroke, the detecting rod 167 is either contacted or not contacted with the coupling member 155 of the slide pin 154. It is thus confirmed whether the bracket 121 is locked or unlocked, and detection signal is applied to an operation controller (not shown).

As shown in FIG. 4, the rotor 56 can be easily detached from the paired shafts 55 when five bolts 173 are pulled out of holes in couplings 172. An attaching shaft 170 is projected integral from the center rear side of each of the flywheels 100 and 101. Projections (or tenons) 171 each being shaped like a letter of T are precision-processed at the front end portion of each of the attaching shafts 170. Recesses (or mortises) 172 each being shaped like a letter of T are precision-processed at the inner end portion of each of the shafts 55. When these projections 171 are fitted into the recesses 172, the attaching shafts 170 can be coaxially engaged with their corresponding shafts 55.

When the rotor 56 is to be detached from the shafts 55 for maintenance, the operator may only pulls the bolts 173 out of holes in the coupling 172 while appropriately rotating the rotor 56 by his hand. The rotor 56 can be therefore detached as a unit and this makes it easier to clean the rotor 56 at the time of maintenance.

The bearing mechanisms 57 are same in structure and they are symmetrical with the rotor 56 interposed between them, as shown in FIGS. 3 and 4. Fixing brackets 175 each being shaped like a rectangular sleeve are welded to outer faces of side walls 92 of the box 54 and bearing units 176 are attached to their corresponding brackets 175. A bearing housing is formed by the fixing bracket 175 and the bearing unit 176.

Each bearing unit 176 includes a casing 177 thrust ball bearings 178, and a magnetic liquid seal 179. The casing 177 is fixed to the fixing bracket 175 at a flange thereof by bolts. A seal packing is interposed between the casing 177 and the fixing bracket 175. The thrust ball bearings 178 are arranged in the casing 177 to support the shaft 55 freely rotatable. The magnetic liquid seal 179 is also arranged in the casing 177 but nearer to the inner end of the casing 177 than the thrust ball bearings 178 are.

The magnetic liquid seal 179 includes a pair of pole pieces 181 between which a permanent magnet 180 is interposed. Viscous gel-like magnetic liquid is held between the magnetic liquid seal 179 and the rotating shaft 55 by magnetic force of these magnet 180 and the pole pieces 181. Grooves are formed round each pole piece 181 and cooling water flows in these grooves.

A labyrinth seal 185 is also arranged in the casing 177 but nearer to the inner end of the casing 177 than the magnetic liquid seal 179 is. The labyrinth seal 185 is intended to form a narrow space (or labyrinth) between the inner end wall of the casing 177 and the outer circumference of the rotating shaft 55. A purge gas introducing passage 186 through which clean air or nitrogen gas ($N_2$) hardly containing any impurity is supplied into the labyrinth is formed in the casing 177. A purge gas discharging passage 187 is formed in the fixing bracket 175 and nitrogen gas in the labyrinth is discharged through the passage 187 by a forcedly discharging mechanism 188. The outer end of the passage 187 is connected to a drain (not shown).

The inside of the box 54 is sealed by the magnetic liquid seals 179 to more reliably prevent particles caused by the bearings 178 from entering into the box 54. In addition, the labyrinth seals 185 and purge gas prevent moisture content from mixing from the inside of the box 54 into the magnetic liquid seals 179.

Further, purge gas is forcedly discharged from the labyrinth by the forcedly discharging mechanism 188. Even if moisture content should enter from the inside of the box 54 into the labyrinth, therefore, it can be forcedly discharged outside together with purge gas.

Still further, slingers 190 and 191 are arranged more inside than the bearing mechanism 57 so as to rotate together with their corresponding shaft 55. They are also arranged sandwiching the side wall 92 between them and along the rim of the shaft hole in the side wall 92. The inner slinger 190 is of double-collar type. Solution drops separated and sprayed can be driven out by the rotating slingers 190 and 191.

As shown in FIG. 3, the rotation drive mechanism 57 has a motor 194 located above one end of the upper base plate 80 through a support 193. The mechanism 58 is of the direct drive type, having an output shaft of the motor 194 directly connected to the rotating shaft 55 by a coupling 196. When the motor 194 is driven, the whole of the rotation holding mechanism 56 is rotated together with the rotating shaft 55 at high speed.

As shown in FIG. 16, the rotation center RC of the rotor 56 is shifted downward from the gravity center GC of the wafers W by about 4 mm. This is because the wafers W are vibrated and rolled in their corresponding grooves to cause noises and also to cause their edges to be worn when the rotation center RC of the rotor 56 is just on the gravity center GC of the wafers W.

A flywheel 197 is attached to the rotating shaft 55 at an appropriate position thereof to enable the rotor 56 to be smoothly rotated. It is provided with rotation stopping hole 198. A stopper pin 201 of a stopper mechanism 200 is arranged to come into and out of the rotation stopping hole 198. When the wafers W are to be transferred to and from the rotor 56, the rotation of the flywheel 197 is stopped by the stopper pin 201 to keep the rotor 56 stationary under a predetermined state. A rotary slit plate 202 and a pulse sensor 203 are provided to automatically position the stopper pin 201 relative to the rotation stopping hole 198 of the flywheel 197.

Figure 27:
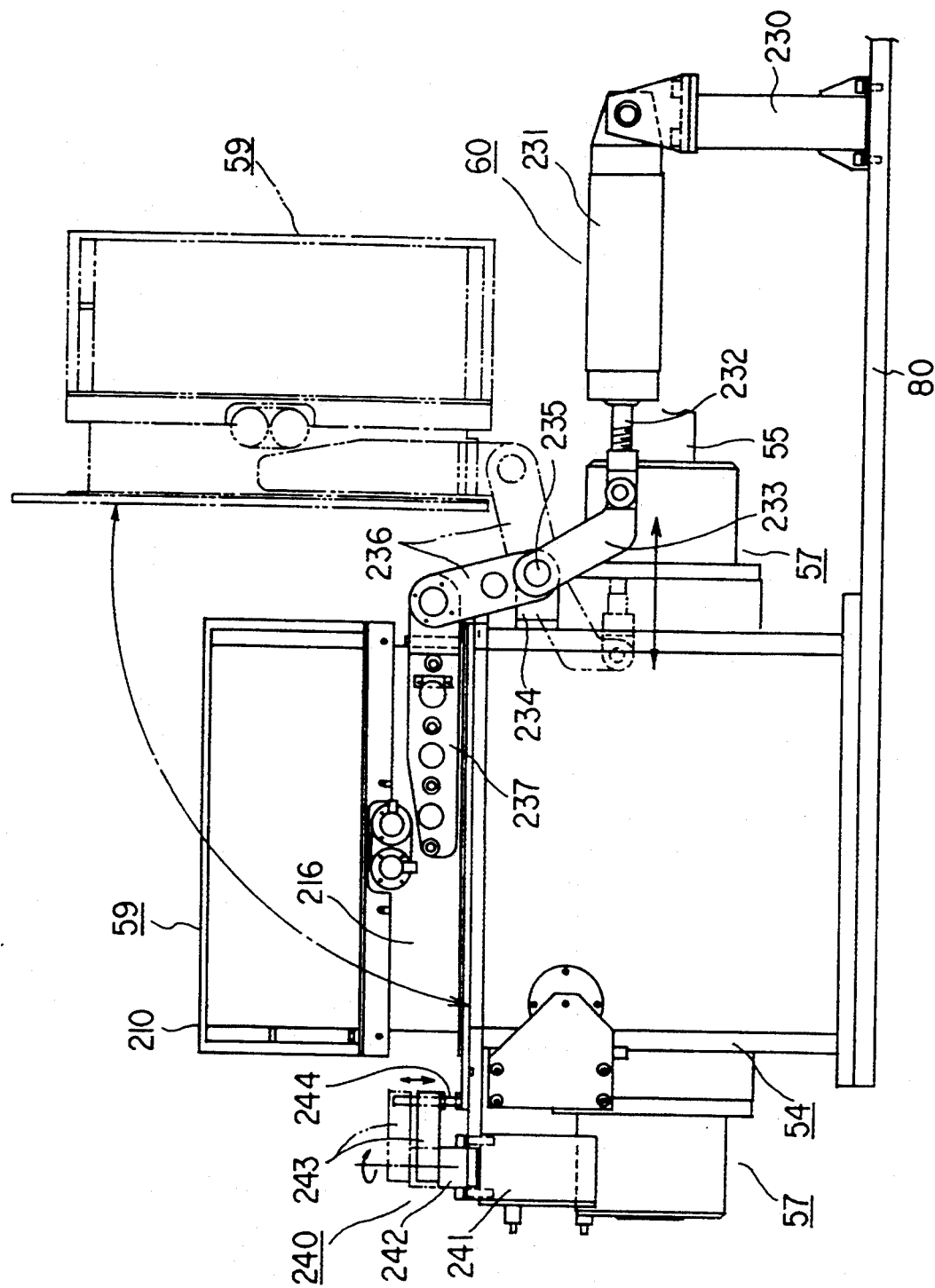
FIG. 27 is a side view showing switching and clamping mechanisms of an air cleaner.
Figure 28:
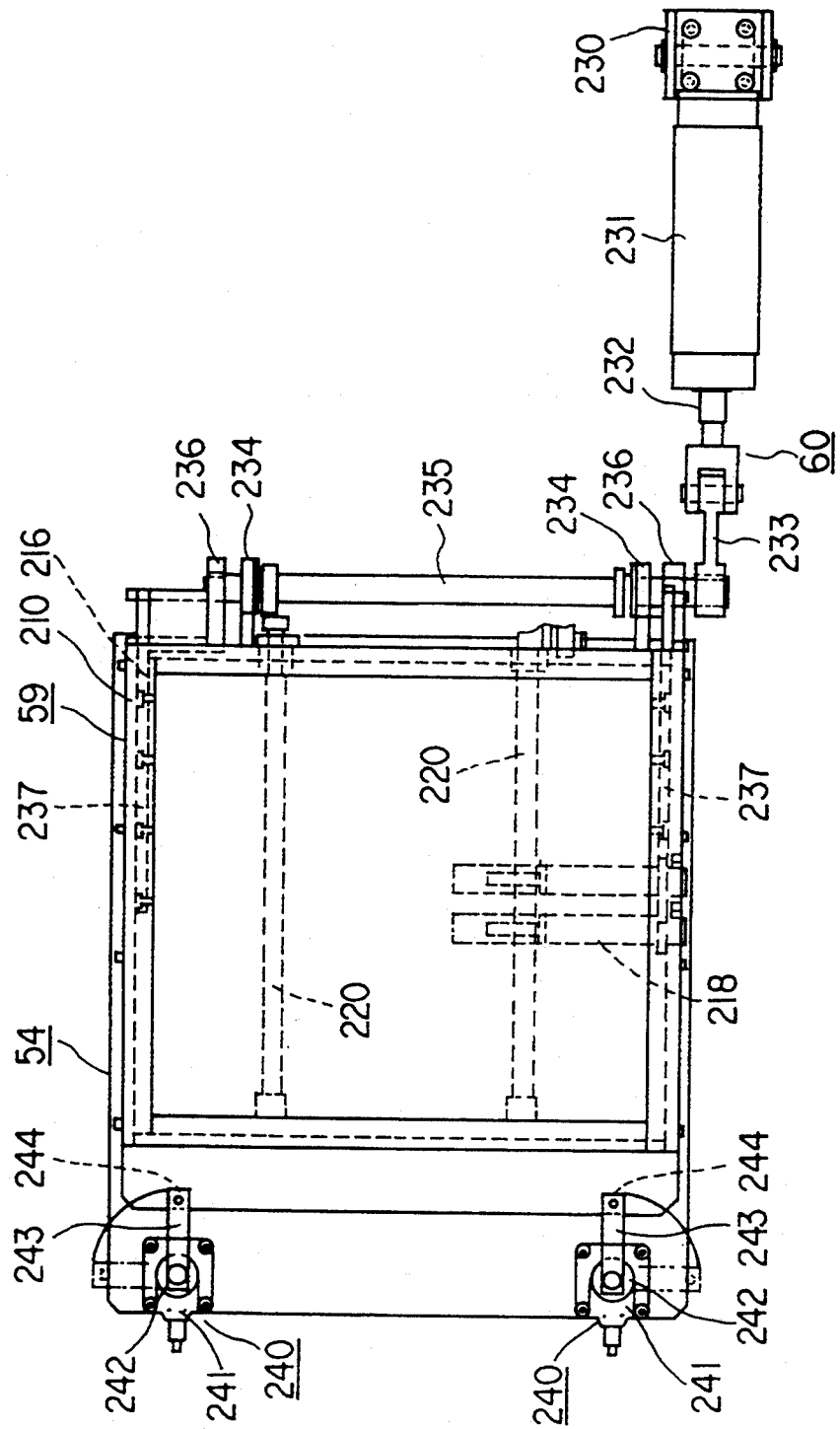
FIG. 28 is a plan showing the switching and clamping mechanisms of the air cleaner.

As shown in FIGS. 27 and 28, an air cylinder 231 of the switching mechanism 60 is supported on the base plate 80 through a stand 230. An L-shaped swing lever 233 is connected to the front end of a rod 232 of the cylinder 231. A shaft 235 is attached to the outer face of the side 92 of the box 54 by a pair of support brackets 234 and it is rotated together with the swing lever 233. A pair of hinge levers 236 are projected from the shaft 235 and rotated together with it. A pair of support arms 237 are fixed to front ends of their corresponding hinge levers 236 to support both sides of an auxiliary frame 216.

when the air cylinder 231 is driven to swing the swing lever 233, the shaft 235 and the hinge levers 236 in the case of this switching mechanism 60, the gas cleaner 59 can be swung by about 90°.

The operation of the embodiment arranged as described above will be described below.

The cassettes 20 in which the wafers to be processed are housed are received in the input buffer section 22 and then temporarily stored in the cassette stocking section 28. The cassettes 20 stored in the cassette stocking section 28 are successively transferred to the loader section 32 by the arms 30 as the wafer process progresses.

The wafers in the cassettes 20 which are not processed yet are carried from the loader section 32 to the chuck cleaning and drying unit 38, the solution processing unit 40, the cleaning unit 42 and the wafer spindrying unit 44 of the present invention by the wafer carrying arm 36 and processed by these units. The wafers thus processed are then housed in the cassettes 20 and carried from the output buffer section 26 to outside. Chemical solutions used for the solution process are ammonia water, hydrogen peroxide water, hydrochloric acid, fluorine and sulfuric acid, for example.

The gas cleaner 59 is opened from the box 54 by the switching mechanism 60 and the rotation of the rotating shaft 55 is stopped by the stopper mechanism 200. While keeping the rotor 56 stationary at a predetermined angle, the upper clamp bars 105–107 are unlocked by the unlock mechanism 160. The upper holder member switching mechanism 130 then advances the transmission shaft 134 to engage the shaft 126 and while keeping this state, the transmission shaft 134 is rotated to erect the upper clamp bars 105–107.

Fifty two sheets of the wafers W which have been cleaned are lowered into the rotor 56 and transferred onto the three lower clamp bars 102–104. The wafers are thus seated in the wafer holding grooves 112 of the lower clamp bars 102–104 at their three lower positions.

The wafer carrying arm 36 is retreated and the wafers W are clamped by the upper clamp bars 105–107. The upper holder member switching mechanism 130 retreats the transmission shaft 134 to release it from the shaft 126. On the other hand, the unlock mechanism 160 is retreated and the lock pin 151 is automatically moved by the lock spring 152 to lock the upper clamp bars 105–107 closed.

When the wafers W are set in the rotating holder mechanism 56 in this manner, the switching mechanism 60 is operated in a manner reverse to the above-described one. The gas cleaner 59 is thus swung to cap the box 54 and the box 54 is clamp-held closed by the clamp mechanism 24. The stopper mechanism 200 is retreated to leave the rotating shaft 55 rotatable.

When the above-mentioned preparation is finished, the motor 194 of the rotation drive mechanism 58 is driven and the whole of the rotation holder mechanism 56 is thus rotated together with the rotating shafts 55 at a predetermined high speed. The gas discharging blower 255 of the gas and solution discharging mechanism 61 is made operative this time to make clean gas cleaner through the filter and to force the cleaner gas from above to down in the box 54. The wafer W are thus dried while separating moisture content from them by centrifugal force and evaporating the moisture content by gas flow.

The amount of clean gas introduced is set about $17^3$/min, when the size of the open top 399 the box 54 is 580 mm×550 mm. Pressure difference inside and outside the box 54 is set about 50 mm $H_2$, for example. The rotation number of the rotation holder mechanism 56 is raised from 0 to 500 rpm and this rotation number of 500 rpm is kept for about 60 seconds to drive out large solution drops from the wafers W centrifugal force. The rotation number of the rotation holder mechanism 56 is then raised to 1500 rpm and this rotation number of 1500 rpm is kept for 2 or 3 minutes to drive out small solution drops from the wafers W and to evaporate moisture content from them by gas flow. Thereafter, the motor 194 is stopped and the rotation of the rotation holder mechanism 56 is gradually stopped within about 20 seconds, for example, to make the drying of the wafers W more complete.

As described above, the rotation number of the rotor 56 is set low or about 500 rpm, for example, at the initial course of rotating the wafers W. In addition, the lowermost perforated plate 416d of the solution drops shielding means in the gas cleaner 59 is separated from the wafers W in the rotor 56 by the distance H, which is larger than the maximum height to which solution drops each having a comparatively large diameter (about 5 mm or more) can reach when they are scattered upward from the wafers W at the rotation number of 500 rpm. This prevents solution drops, which have the comparatively large diameter, from adhering to the punched plate 416d.

Further, the other three punched plates 416a, 416b and 416c of the solution drop shielding means are separated from one another in the vertical direction and their ventilation holes 417 are shifted from those of their adjacent one. Therefore, small solution drops which are scattered upward from the wafers W at the high speed rotation of the rotor 56 as well as the above-mentioned large ones can be prevented from passing through the three perforated plates 416a–416c. This can more reliably prevent the capacity of the filter 412, which is located on the solution drops shielding means, from being lost by moisture content.

Still further, the lowermost punched plate 416d has its ventilation holes 417 regularly arranged all over it. Therefore, the clean gas which is introduced into the box 54 is not drifted but rectified to flow downward as a laminar flow. This clean gas contacts the surface of each wafer W, which is held by the rotation holder mechanism 56 and rotated together with it, to evaporate moisture content from the surface of each wafer W. The gas in which the moisture content from the wafers W is thus contained can further flow downward as a laminar flow without staying in the box 54. In addition, the sectioned area of the box 54 becomes smaller from above to below. Therefore, the flow velocity of the gas which flows downward becomes larger as the gas comes nearer to the bottom discharge opening 249. The flow velocity of the gas is about 1 m/sec, for example, at the bottom discharge opening 249 of the box 54. Even if solution drops which have been made finer collide against inner faces of the box 54 and splashed back by these faces, therefore, they can be more efficiently discharged downward by the gas whose flow velocity has become large and they will not adhere to the wafers W again.

The gas in which moisture content in the box 54 is contained and solution drops which flow down on the inner faces of the box 54 can be more quickly introduced into the gas and solution separator 251 of the gas and solution discharging mechanism 61 through the bottom discharge opening 249 of the box 54. The moisture content in the gas is separated by the gas and solution separator 251 and collected in the water collecting section 252 on the bottom of the gas and solution discharging mechanism 61. It is discharged outside through the drain opening 253, if necessary, and the gas thus separated is discharged outside from the gas and solution separator 251 through the gas discharging duct 254 by the blower 255.

On the other hand cooling water is supplied into the cooling water introducing hole 183 of the bearing unit 176 of each bearing mechanism 57 as shown in FIGS. 3 and 4, while rotating the rotation holder mechanism 56 to dry the wafers W. The bearing sections can be thus cooled. In addition, clean gas such as nitrogen gas is supplied, as purge gas, into the gas introducing passage 186.

Further, the box 54 is sealed by the magnetic liquid seals 179 of the bearing units 176 of the bearing mechanisms 57. Particles caused by the bearings 178 can be thus reliably prevented from entering into the box 54. In addition, moisture content can be prevented from mixing from the inside of the box 54 into the magnetic liquid seals 179 by purge gas supplied to the labyrinth seals 185 and to the narrow labyrinth spaces.

Still further, clean gas supplied to the labyrinth seals 185 and to the narrow labyrinth spaces of the bearing mechanism 57 is forcedly discharged outside through the purge gas introducing passage 187 by the forcedly discharging mechanism 188. Even if moisture content should enter from the inside of the box 54 into these seals and spaces, it can be forcedly discharged outside together with the purge gas. This can more completely prevent moisture content from mixing into the magnetic liquid seals 179.

Still further, the large collar-shaped slingers 190 and 191 which are rotated together with the rotating shafts 55 are arranged more inside each bearing mechanism 57 and along the rim of each shaft hole of the box 54, sandwiching each side 92 of the box 54 between them. Moisture content coming from the inside of the box 54 is therefore splashed back by the slingers 190 and 191, so that it can be reliably prevented from mixing into the magnetic liquid seals 179. Each inner slinger 190 is particularly of the double-collar type. This can more reliably prevent the moisture content from entering from the inside of the box 54 into the bearings. Therefore, the capacity of the magnetic liquid seals 179 which are damaged by moisture content can be kept to achieve a higher sealing effect.

Still further, when the ionizer 422 attached to the outer frame 406 is made operative in the course of drying the wafers W, plus and minus ions are generated to neutralize and remove charge from the wafers W. This can more reliably prevent particles from adhering to the surface of each wafer W.

Still further, air (clean air or $N_2$ gas) is supplied into the air pipes 322, which are arranged on both sides of the box 54, through external hoses and jetted into the wafer holding grooves mainly on the lower clamp bars 102, 103 and 104 of the rotation holder mechanism 56, while drying the wafers W, to drive out pure water and other cleaning solutions present between each groove and the wafer in it. This enables the drying time to be shortened and particles to be reduced.

According to the spin-drying unit of the present invention, therefore, the semiconductor wafers W to which process solution such as water adheres can be more quickly dried for a shorter time while preventing particles and others from adhering to the surface of each wafer W.

Particularly, each wafer holding groove 112 or 117 on the clamp bars 102-107 of the rotation holder mechanism 56 is shaped like a letter of V when vertically sectioned. When the wafer W is seated in each wafer holding groove, therefore, each inner face of the groove is not made parallel to the wafer W but tilted relative to the wafer W by an appropriate angle. This makes it easier to remove impurities such as pure water and other cleaning solutions, which have entered into the grooves, by the rotation of the rotor 56. The time needed to dry and clean the wafers W can be thus shortened and particles which will adhere to the wafers W can be reduced as well.

Even when the wafer holding grooves 113 which are vibration are used, the wafers W can be smoothly seated in their corresponding grooves as seen in the case of the wafer holding grooves 112. In addition, each inner face of the groove 113 is not made parallel to the wafer W but tilted relative to the wafer W by an appropriate angle. This makes it easier to remove impurities such as pure water and other cleaning solutions, which have entered into the grooves 113, by the rotation of the rotor 56. The time needed to dry and clean the wafers W can be thus shortened and particles which will adhere to the wafers W can be reduced.

After the wafer drying process is finished, the rotation of the rotating shaft 55 is stopped by the stopper mechanism 200 as described above. The rotation holder mechanism 56 in the box 54 is thus kept stationary at a predetermined angle. The switching mechanism 60 is made operative to swing the gas cleaner 59 upward to open the box 54. The unlock mechanism 160 then advances to unlock the upper holder members 105-107 of the rotation holder mechanism 56 and the upper holder member switching mechanism 130 advances and rotates to swing the upper holder members 105-107 erected and opened. The wafer carrying arm 36 moves under this state to clamp the wafers a in the rotation holder mechanism 56, while keeping them vertical at a same pitch, and to carry them out of the box 54 to a next process station. Next wafers W which have been cleaned are then carried into the box 54 and then into the rotor 56 and the same drying process is repeated relative to the wafers W as described above.

When the inside of the box 54 is to be cleaned, the gas cleaner 59 as swung to close the box 54 and cleaning solution is supplied to the right and left cleaning solution supply pipes 322 in the gas cleaner 59 through external hoses. It is thus jetted onto the inner faces of the box 54 and the rotation holder mechanism 56 in the box 54 through the jetting nozzles 314. The box 54 and components in it can be thus periodically cleaned.

When periodic maintenance such as cleaning and checking is to be carried out, the bolts 173 are detected from the shafts 55, while appropriately rotating the rotation holder mechanism 56 in the box 54 by hand. The whole of the rotation holder mechanism 56 can be thus easily detached from the shafts 55 and outside the box 54. This makes it quite easier and more efficient to carry out cleaning and other maintenance works relative to the inside of the box 54 and the rotation holder mechanism 56.

Although the spin-drying unit according to an embodiment of the present invention has been used to dry the wafers, it is not limited to this example but can be used to dry LCD and printed substrates. The present invention can also be applied to other spin-processing systems such as the resist and developer coating ones.

The system can be conveniently conducted using apparatus such as is disclosed in U.S. Ser. No. 07/791,137, filed Nov. 11, 1991 to Yuji KAMIKAWA and U.S. Ser. No. 07/862,357, filed Apr. 2, 1992 to Kinya UENO, the teachings of which are hereby incorporated by reference.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A spindrier for removing solution or solution drops from a plurality of substrates by centrifugal force comprising:
   a box enclosing the substrates and having a gas inlet port in an upper portion and a gas outlet port in a lower portion;
   means for rotating the substrates in the box;
   clamp holder means for holding the substrates face to face and substantially perpendicular to a rotating shaft of the rotating means;
   a gas introducing mechanism positioned below said clamp holder means and communicating with said gas inlet port and;
   a gas discharging mechanism positioned below said clamp holder means and communicating with said gas outlet port;
   wherein:
   a gas stream generated by said gas introducing mechanism and said gas discharging mechanism is formed such that the cross sectional area of said gas stream in a direction perpendicular to the gas flowing direction is smaller on a side of the gas outlet port than on a side of the gas inlet port; and
   the gas introducing mechanism is provided with a filter means having a length larger than a length of the substrate-supporting portion of the clamp holder means and a width larger than a diameter of the substrate.

2. The spindrier according to claim 1, wherein said gas introducing mechanism is provided with a wetting-preventing means to prevent solution drops centrifugally separated from the substrate from reaching said filter means.

3. The spindrier according to claim 2, wherein said wetting-preventing means includes plural perforated plates each having a plurality of apertures and said perforated plates are arranged face to face at a certain interval while the apertures of each perforated plate are shifted from the apertures of its adjacent perforated plate.

4. The spindrier according to claim 1, wherein said gas discharging mechanism includes a container or vessel in which gas to be discharged is caused to collide against inner faces of the container to separate moisture content from the gas, and vacuum discharging means communicated with the gas and solution separating container.

5. The spindrier according to claim 4, further comprising a gas flow adjusting member arranged in the gas and solution separating container to limit and change the flow of gas in the container.

6. The spindrier according to claim 1, wherein said clamp holder means includes plural clamp bars on each of which a plurality of grooves for holding the substrates therein are formed.

7. The spindrier according to claim 6, wherein each substrate holding groove is shaped like a letter of V when vertically sectioned, and each side wall of the groove is tilted relative to a line vertically extending through the center of the groove by an angle of 15–45 degrees.

8. The spindrier according to claim 6, wherein each substrate holding groove is shaped like a letter of Y when vertically sectioned, and each lower side wall of the groove is tilted relative to the vertical center line by an angle of 4–12 degrees while each upper side wall of the groove is tilted relative to the vertical center line by an angle of 20–45 degrees.

9. The spindrier according to claim 1, wherein the rotating shaft of said rotating means is made substantially horizontal.

10. The spindrier according to claim 9, wherein each substrate is held by said clamp holder means in such a way that its gravity center is shifted from the rotating shaft of said rotating means.

11. The spindrier according to claim 1, wherein said box is shaped to have a form whose area sectioned perpendicularly to the flow of as becomes smaller and smaller as the area comes nearer to the open bottom along the flow of gas.

12. The spindrier according to claim 1, wherein said box comprises a first tapered section in which the cross sectional area of the box is slowly diminished in the downward direction and a second tapered section positioned between said first tapered section and the gas outlet port and having the cross sectional area rapidly diminished in the downward direction.

13. The spindrier according to claim 1, wherein said shaft of the rotating means extends substantially in horizontal direction.

14. A spindrier for removing solution or solution drops from a plurality of substrates comprising
   a box enclosing the substrates;
   means for rotating the substrates in the box;
   clamp holder means for holding the substrates face to face and substantially perpendicular to a rotating shaft of said rotating means; and
   means for generating a flow of gas in the box, said gas flow generator means including a gas introducing opening at the top of said box,
   filter means arranged between the gas introducing opening and the substrates; and
   solution drops shielding means arranged between the filter means and the substrates,
   wherein said solution drops shielding means includes plural perforated plates each having a plurality of apertures and said perforated plates are arranged face to face at a certain interval while the apertures of each perforated plate are shifted from the apertures of its adjacent perforated plate.

* * * * *